(12) United States Patent
Lee et al.

(10) Patent No.: US 12,500,216 B2
(45) Date of Patent: Dec. 16, 2025

(54) DISPLAY DEVICE AND TILED DISPLAY DEVICE INCLUDING THE SAME

(71) Applicant: Samsung Display Co., LTD., Yongin-si (KR)

(72) Inventors: Kye Uk Lee, Seoul (KR); Nak Cho Choi, Yongin-si (KR); Sang Woo An, Asan-si (KR); Yong Duck Son, Seongnam-si (KR); Won Ho Jang, Hwaseong-si (KR); Jung Hwan Hwang, Seongnam-si (KR); Myung Koo Hur, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 491 days.

(21) Appl. No.: 18/158,421

(22) Filed: Jan. 23, 2023

(65) Prior Publication Data
US 2023/0238394 A1  Jul. 27, 2023

(30) Foreign Application Priority Data

Jan. 27, 2022  (KR) .................. 10-2022-0012363
Mar. 25, 2022  (KR) .................. 10-2022-0037492

(51) Int. Cl.
H01L 25/16    (2023.01)
H10D 86/40   (2025.01)
H01L 23/00    (2006.01)

(52) U.S. Cl.
CPC ......... *H01L 25/167* (2013.01); *H10D 86/441* (2025.01); *H01L 24/05* (2013.01);
(Continued)

(58) Field of Classification Search
CPC .................. H01L 25/167; H10D 86/441
See application file for complete search history.

(56) References Cited

U.S. PATENT DOCUMENTS 11,637,169 B2    4/2023  Jang et al.
2020/0203235 A1*  6/2020  Jung .................... H01L 25/167
(Continued)

FOREIGN PATENT DOCUMENTS

CN   116487389 A   7/2023
EP    4220715 A1   8/2023
(Continued)

OTHER PUBLICATIONS

Office Action dated Aug. 20, 2025 regarding Korean Patent Application No. 10-2022-0037492 corresponding to U.S. Appl. No. 18/158,421 (7 pages).

*Primary Examiner* — Peter M Albrecht
(74) *Attorney, Agent, or Firm* — Womble Bond Dickinson (US) LLP

(57) ABSTRACT

A display device includes a substrate including a first surface, a second surface opposite to the first surface, a first chamfered surface extending from one side of the first surface, a second chamfered surface extending from one side of the second surface, and a side surface connecting the first chamfered surface to the second chamfered surface, a pixel on the first surface of the substrate and including a light emitting element to emit light, a plurality of front pad parts on an edge of the first surface of the substrate and electrically connected to the pixel, a plurality of rear pad parts on an edge of the second surface of the substrate, and a plurality of side surface connection lines on the side surface of the substrate electrically connecting the plurality of front pad parts to the plurality of rear pad parts.

29 Claims, 24 Drawing Sheets

(52) U.S. Cl.
CPC .............. *H01L 24/08* (2013.01); *H01L 24/13* (2013.01); *H01L 24/16* (2013.01); *H01L 2224/05026* (2013.01); *H01L 2224/05073* (2013.01); *H01L 2224/05561* (2013.01); *H01L 2224/05573* (2013.01); *H01L 2224/05686* (2013.01); *H01L 2224/08135* (2013.01); *H01L 2224/13021* (2013.01); *H01L 2224/16225* (2013.01); *H01L 2924/0549* (2013.01); *H01L 2924/12041* (2013.01); *H10D 86/411* (2025.01)

(56) References Cited

U.S. PATENT DOCUMENTS

| | | | |
|---|---|---|---|
| 2021/0225928 A1* | 7/2021 | Lu | H01L 25/167 |
| 2021/0375700 A1* | 12/2021 | Xiao | H10D 86/441 |
| 2022/0007504 A1* | 1/2022 | Chen | H10D 86/441 |
| 2023/0207318 A1 | 6/2023 | Choi et al. | |
| 2023/0207577 A1 | 6/2023 | Kim | |
| 2023/0232682 A1 | 7/2023 | Jang et al. | |
| 2023/0238372 A1 | 7/2023 | Lee et al. | |
| 2023/0238494 A1 | 7/2023 | Choi et al. | |

FOREIGN PATENT DOCUMENTS

| | | |
|---|---|---|
| JP | H01-7034235 B2 | 3/2022 |
| KR | 10-2017-0080266 A | 7/2017 |
| KR | 10-2019-0044016 A | 4/2019 |
| KR | 10-2019-0081914 A | 7/2019 |
| KR | 10-2021-0061957 A | 5/2021 |
| KR | 10-2021-0068356 A | 6/2021 |
| KR | 20210086309 | 7/2021 |
| KR | 10-2021-0136835 A | 11/2021 |
| KR | 10-2344277 B1 | 12/2021 |
| KR | 20210158844 A | 12/2021 |
| KR | 2023-0097279 A | 7/2023 |
| KR | 2023-0100763 A | 7/2023 |
| KR | 2023-0113472 A | 7/2023 |
| KR | 2023-0116153 A | 8/2023 |

* cited by examiner

DISPLAY DEVICE AND TILED DISPLAY DEVICE INCLUDING THE SAME

CROSS-REFERENCE TO RELATED APPLICATION

This application claims priority to and the benefit of Korean Patent Application No. 10-2022-0012363, filed on Jan. 27, 2022, and Korean Patent Application No. 10-2022-0037492, filed on Mar. 25, 2022, in the Korean Intellectual Property Office, the entire contents of which are incorporated by reference herein.

BACKGROUND

1. Field

The present disclosure relates to a display device and a tiled display device including the same.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device, and an organic light emitting display device. Among the flat panel display devices, in the light emitting display device, because each of pixels of a display panel includes a light emitting element capable of emitting light by itself, an image can be displayed without a backlight unit providing light to the display panel.

When the display device is manufactured in a large size, a defect rate of the light emitting element may increase due to an increase in the number of pixels, thereby deteriorating productivity or reliability of the display device. To solve this problem, in a tiled display device, a large-sized screen may be implemented by connecting a plurality of display devices having a relatively small size. The tiled display device may include a boundary portion called a seam between the plurality of display devices, due to a non-display area or a bezel area of each of the plurality of display devices adjacent to each other. When a single image is displayed on the entire screen, the boundary portion between the plurality of display devices gives a sense of disconnection over the entire screen, thereby reducing a sense of immersion in the image.

SUMMARY

Aspects and features of embodiments of the present disclosure provide a display device capable of reducing a pad resistance and a line resistance of a front pad part disposed on a first surface of a substrate, a rear pad part disposed on a second surface of the substrate, and a side surface connection line electrically connecting the front pad part to the rear pad part, and a tiled display device including the same.

Aspects and features of embodiments of the present disclosure provide a display device capable of removing a sense of disconnection between a plurality of display devices and improving a sense of immersion in an image by preventing a coupling area between the plurality of display devices from being recognized, and a tiled display device including the same.

However, aspects and features of embodiments of the present disclosure are not restricted to those set forth herein. The above and other aspects and features of embodiments of the present disclosure will become more apparent to one of ordinary skill in the art to which the present disclosure pertains by referencing the detailed description of the present disclosure given below.

According to one or more embodiments of the present disclosure, a display device includes a substrate including a first surface, a second surface opposite to the first surface, a first chamfered surface extending from one side of the first surface, a second chamfered surface extending from one side of the second surface, and a side surface connecting the first chamfered surface to the second chamfered surface, a pixel on the first surface of the substrate and including a light emitting element to emit light, a plurality of front pad parts on an edge of the first surface of the substrate and electrically connected to the pixel, a plurality of rear pad parts on an edge of the second surface of the substrate, and a plurality of side surface connection lines on the side surface of the substrate electrically connecting the plurality of front pad parts to the plurality of rear pad parts. The plurality of front pad parts includes a plurality of first front pad parts configured to supply a data voltage to the pixel, and a second front pad part configured to supply a power voltage to the pixel. An area of the second front pad part is larger than an area of one of the plurality of first front pad parts.

The plurality of rear pad parts may include a plurality of first rear pad parts electrically connected to the plurality of first front pad parts, and a second rear pad part electrically connected to the second front pad part. An area of the second rear pad part may be larger than an area of one of the plurality of first rear pad parts.

Some of the plurality of side surface connection lines may be connected in one-to-one correspondence to each of the plurality of first front pad parts. Some other ones of the plurality of side surface connection lines may be connected many-to-one to the second front pad part.

The display device may further include a plurality of first rear surface connection lines on the second surface of the substrate and connected to the plurality of first rear pad parts, and a second rear surface connection line on the second surface of the substrate and connected to the second rear pad part. A width of the second rear surface connection line may be greater than a width of one of the plurality of first rear surface connection lines.

The display device may further include a plurality of first contact pad parts on the second surface of the substrate and connected to the plurality of first rear surface connection lines, and a second contact pad part on the second surface of the substrate and connected to the second rear surface connection line. An area of the second contact pad part may be larger than an area of one of the plurality of first contact pad parts.

Each of the plurality of side surface connection lines may include a front portion on the first surface of the substrate and connected to the plurality of front pad parts, a first chamfer portion on the first chamfered surface of the substrate and connected to the front portion, a side portion on the side surface of the substrate and connected to the first chamfer portion, a second chamfer portion on the second chamfered surface of the substrate and connected to the side portion, and a rear portion on the second surface of the substrate and connected between the second chamfer portion and a rear pad part of the plurality of rear pad parts.

Each of the front portions of some of the plurality of side surface connection lines may be connected in one-to-one correspondence to each of the plurality of first front pad parts. The front portions of some others of the plurality of side surface connection lines may be connected many-to-one to the second front pad part.

The plurality of side surface connection lines may include a plurality of first side surface connection lines connected to the plurality of first front pad parts, and a second side surface connection line electrically connected to the second front pad part. A width of the second side surface connection line may be greater than a width of one of the plurality of first side surface connection lines.

Each of the plurality of first side surface connection lines may be connected in one-to-one correspondence to each of the plurality of first front pad parts. The second side surface connection line may be connected one-to-one to the second front pad part.

The plurality of rear pad parts may include a plurality of first rear pad parts electrically connected to the plurality of first front pad parts, and a second rear pad part electrically connected to the second front pad part. An area of the second rear pad part may be larger than an area of one of the plurality of first rear pad parts.

Each of the plurality of first side surface connection lines may be connected in one-to-one correspondence to each of the plurality of first rear pad parts. The second side surface connection line may be connected one-to-one to the second rear pad part.

The second side surface connection line may include a front portion on the first surface of the substrate and connected to the second front pad part, a first chamfer portion on the first chamfered surface of the substrate and connected to the front portion, a side portion on the side surface of the substrate and connected to the first chamfer portion, a second chamfer portion on the second chamfered surface of the substrate and connected to the side portion, and a rear portion on the second surface of the substrate and connected between the second chamfer portion and the second rear pad part.

According to one or more embodiments of the present disclosure, a display device includes a substrate including a first surface, a second surface opposite to the first surface, a first chamfered surface extending from one side of the first surface, a second chamfered surface extending from one side of the second surface, and a side surface connecting the first chamfered surface to the second chamfered surface, a pixel on the first surface of the substrate and including a light emitting element to emit light, a plurality of front pad parts on an edge of the first surface of the substrate and electrically connected to the pixel, a plurality of rear pad parts on an edge of the second surface of the substrate, and a plurality of side surface connection lines on the side surface of the substrate electrically connecting the plurality of front pad parts to the plurality of rear pad parts. The plurality of front pad parts includes a plurality of first front pad parts configured to supply a data voltage to the pixel, and at least one second front pad part configured to supply a power voltage to the pixel. The plurality of side surface connection lines includes a plurality of first side surface connection lines connected to the plurality of first front pad parts, and a second side surface connection line electrically connected to the at least one second front pad part. The second side surface connection line includes a plurality of front portions on the first surface of the substrate and connected to the at least one second front pad part, and a rear portion on the second surface of the substrate and connected to one of the plurality of rear pad parts.

The second side surface connection line may further include a plurality of first chamfer portions on the first chamfered surface of the substrate and connected to the plurality of front portions, a plurality of first side portions on the side surface of the substrate and connected to the plurality of first chamfer portions, a second side portion on the side surface of the substrate and connected to the plurality of first side portions, and a second chamfer portion on the second chamfered surface of the substrate and connected between the second side portion and the rear portion.

The plurality of first side portions may be branched into a plurality of portions from the second side portion on the side surface of the substrate.

An area of one of the plurality of first front pad parts and an area of one of the at least one second front pad part may be substantially the same.

An area of one of the at least one second front pad part may be larger than an area of one of the plurality of first front pad parts.

The plurality of rear pad parts may include a plurality of first rear pad parts electrically connected to the plurality of first front pad parts, and a second rear pad part electrically connected to the second front pad part. An area of the second rear pad part may be larger than an area of one of the plurality of first rear pad parts. According to one or more embodiments of the present disclosure, a display device includes a substrate including a first surface, a second surface opposite to the first surface, a first chamfered surface extending from one side of the first surface, a second chamfered surface extending from one side of the second surface, and a side surface connecting the first chamfered surface to the second chamfered surface, a thin film transistor layer on the first surface of the substrate and including a thin film transistor, a first source metal layer on the thin film transistor layer, a second source metal layer on the first source metal layer, a passivation layer on the second source metal layer, a plurality of front pad parts in an area in which a part of the passivation layer is opened at an edge of the second source metal layer, a plurality of first connection patterns on a first side of each of the plurality of front pad parts, and a second connection pattern on a second side adjacent to the first side of each of the plurality of front pad parts to connect the plurality of first connection patterns, wherein the plurality of first connection patterns and the second connection pattern are formed by stacking the first and second source metal layers.

The display device may further include a plurality of rear pad parts on an edge of the second surface of the substrate, and a plurality of side surface connection lines on the side surface of the substrate to electrically connect the plurality of front pad parts to the plurality of rear pad parts. At least one side of each of the plurality of side surface connection lines may be surrounded by the plurality of first connection patterns and the second connection pattern.

A height of the first and second connection patterns may be higher than a height of a front pad part of the plurality of front pad parts.

The display device may further include a third source metal layer between the thin film transistor layer and the first source metal layer. The plurality of first connection patterns and the second connection pattern may be formed by stacking the first to third source metal layers.

The display device may further include a fourth source metal layer between the thin film transistor layer and the third source metal layer. The plurality of first connection patterns and the second connection pattern may be formed by stacking the first to fourth source metal layers.

According to one or more embodiments of the present disclosure, a tiled display device includes a plurality of display devices configured to display an image, and a coupling area between the plurality of display devices. At least one of the plurality of display devices includes a substrate including a first surface, a second surface opposite to the first surface, a first chamfered surface extending from one side of the first surface, a second chamfered surface extending from one side of the second surface, and a side surface connecting the first chamfered surface to the second chamfered surface, a pixel on the first surface of the substrate and including a light emitting element to emit light, a plurality of front pad parts on an edge of the first surface of the substrate and electrically connected to the pixel, a plurality of rear pad parts on an edge of the second surface of the substrate, and a plurality of side surface connection lines on the side surface of the substrate to electrically connect the plurality of front pad parts to the plurality of rear pad parts. The plurality of front pad parts includes a plurality of first front pad parts configured to supply a data voltage to the pixel, and a second front pad part configured to supply a power voltage to the pixel. An area of the second front pad part is larger than an area of one of the plurality of first front pad parts.

The light emitting element may be a micro light emitting diode of a flip chip type.

The substrate may be made of glass.

The plurality of rear pad parts may include a plurality of first rear pad parts electrically connected to the plurality of first front pad parts, and a second rear pad part electrically connected to the second front pad part. An area of the second rear pad part may be larger than an area of one of the plurality of first rear pad parts.

At least one of the plurality of display devices may further include a circuit board on the second surface of the substrate and electrically connected to the plurality of rear pad parts.

The plurality of display devices may be arranged in a matrix form in M (M is a positive integer) rows and N (N is a positive integer) columns.

According to the display device according to embodiments and the tiled display device including the same, the quality may be improved by reducing the pad resistance or the line resistance and improving power transmission efficiency by realizing the front pad part on the first surface of the substrate to supply a power voltage to a pixel, the rear pad part on the second surface of the substrate to be electrically connected to the front pad part, and the side surface connection line electrically connecting the front pad part to the rear pad part, with a cylindrical pad or a cylindrical line.

According to the display device according to the embodiments and the tiled display device including the same, a gap between the plurality of display devices is reduced or minimized, so that a sense of immersion in an image may be improved by preventing a user from recognizing the coupling area between the plurality of display devices and improving a sense of disconnection between the plurality of display devices.

However, the effects, aspects, and features of the present disclosure are not limited to the aforementioned effects, aspects, and features and various other effects, aspects and features are included in the present disclosure.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
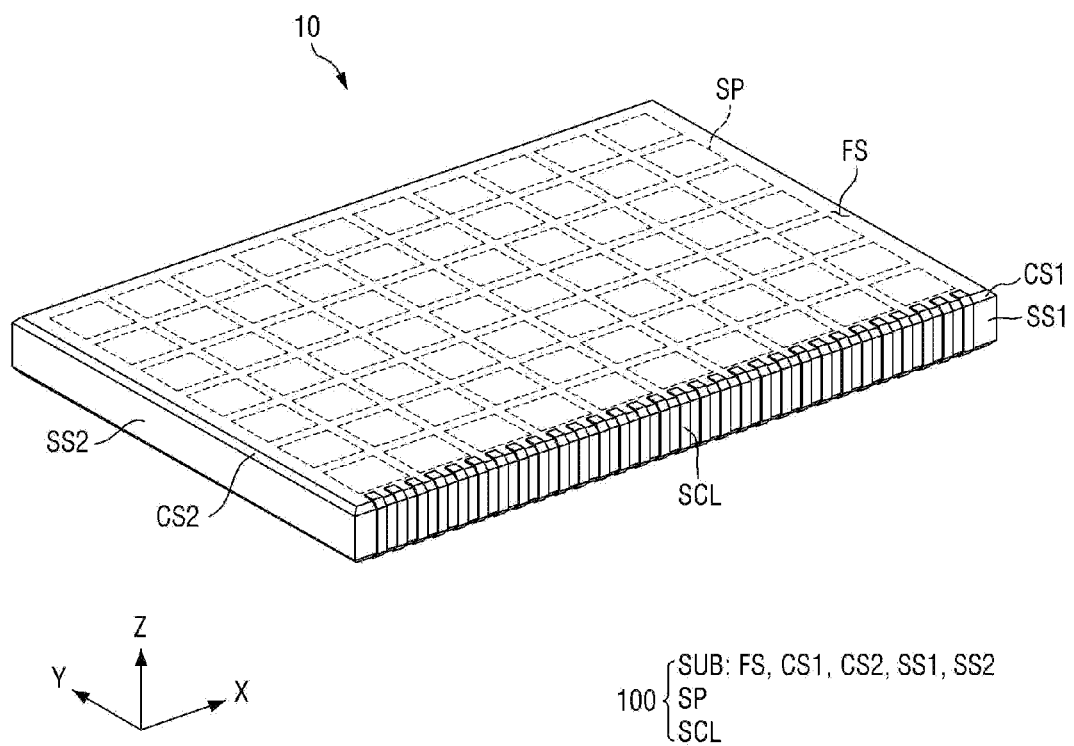
FIGS. 1 and 2 are perspective views illustrating a display device according to one or more embodiments.

In the following description, for the purposes of explanation, numerous specific details are set forth in order to provide a thorough understanding of various embodiments or implementations of the present disclosure. As used herein "embodiments" and "implementations" are interchangeable words that are non-limiting examples of devices or methods employing one or more embodiments of the present disclosure disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the present disclosure.

Unless otherwise specified, the illustrated embodiments are to be understood as providing features of varying detail of some ways in which the present disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the present disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X, Y, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the present disclosure. Further, the blocks, units, parts, and/or modules of some embodiments may be physically combined into more complex blocks, units, parts, and/or modules without departing from the scope of the present disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the present disclosure, and should not be interpreted in an ideal or overly formal sense, unless clearly so defined herein.

Hereinafter, detailed embodiments of the present disclosure will be described with reference to the accompanying drawings.

Figure 2:
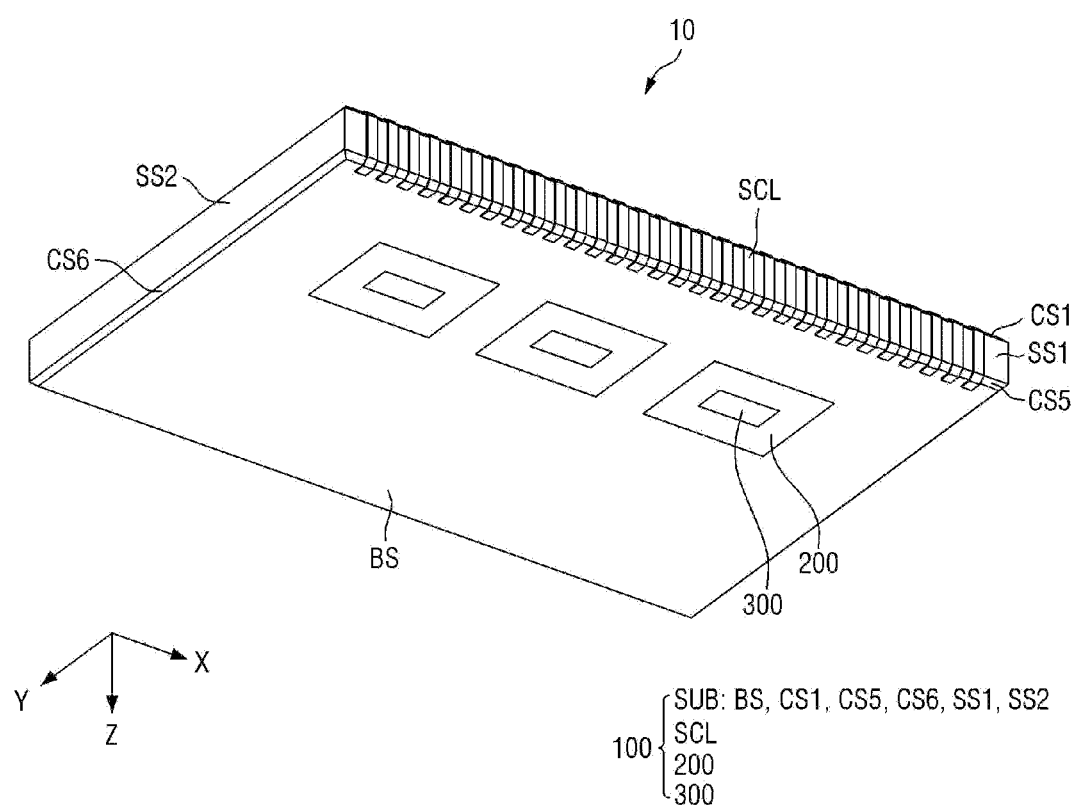

FIGS. 1 and 2 are perspective views illustrating a display device according to one or more embodiments.

Referring to FIGS. 1 and 2, a display device 10, as a device for displaying a moving or still image, may be employed as a display screen of various products such as a television, a laptop computer, a monitor, a billboard, and an Internet of Things (IoT) device as well as portable electronic devices such as a mobile phone, a smartphone, a tablet personal computer (PC), a smart watch, a watch phone, a mobile communication terminal, an electronic notebook, an eBook reader, a portable multimedia player (PMP), a navigation device, and an ultra-mobile PC (UMPC).

The display device 10 may include a display panel 100, a circuit board 200, and a display driver 300.

The display panel 100 may include a substrate SUB, a plurality of pixels SP, and a plurality of side surface connection lines SCL. The substrate SUB may include a first surface FS, a second surface BS, a plurality of chamfered surfaces CS1 to CS8, and a plurality of side surfaces SS1 to SS4.

The first surface FS may be the front surface of the substrate SUB. The first surface FS may have a rectangular shape having a long side in the first direction (X-axis direction) and a short side in the second direction (Y-axis direction).

The second surface BS may be a surface opposite to the first surface FS. The second surface BS may be a rear surface of the substrate SUB. The second surface BS may have a rectangular shape having a long side in the first direction (X-axis direction) and a short side in the second direction (Y-axis direction). The second surface BS may be a surface opposite to the first surface FS.

The plurality of chamfered surfaces CS1 to CS8 refer to obliquely cut surfaces disposed between the first surface FS and the plurality of side surfaces SS1 to SS4 and between the second surface BS and the plurality of side surfaces SS1 to SS4, to prevent chipping defects from occurring in the side surface connection line SCL. Because the bending angle of the side surface connection line SCL may be gentle due to the plurality of chamfered surfaces CS1 to CS8, it is possible to prevent chipping or cracking from occurring in the side surface connection line SCL.

The first chamfered surface CS1 may extend from a first side, for example, a lower side of the first surface FS. The second chamfered surface CS2 may extend from a second side, for example, a left side of the first surface FS. The third chamfered surface CS3 may extend from a third side, for example, an upper side of the first surface FS. The fourth chamfered surface CS4 may extend from a fourth side, for example, a right side of the first surface FS. An interior angle formed between the first surface FS and the first chamfered surface CS1, an interior angle formed between the first surface FS and the second chamfered surface CS2, an interior angle formed between the first surface FS and the third chamfered surface CS3, and an interior angle formed between the first surface FS and the fourth chamfered surface CS4 may be greater than 90 degrees.

The fifth chamfered surface CS5 may extend from a first side, for example, a lower side of the second surface BS. The sixth chamfered surface CS6 may extend from a second side, for example, a left side of the second surface BS. The seventh chamfered surface CS7 may extend from a third side, for example, an upper side of the second surface BS. The eighth chamfered surface CS8 may extend from a fourth side, for example, a right side of the second surface BS. An interior angle between the second surface BS and the fifth chamfered surface CS5, an interior angle formed between the second surface BS and the sixth chamfered surface CS6, an interior angle formed between the second surface BS and the seventh chamfered surface CS7, and an interior angle formed between the second surface BS and the eighth chamfered surface CS8 may be greater than 90 degrees.

The first side surface SS1 may extend from the first chamfered surface CS1. The first chamfered surface CS1 may be disposed between the first surface FS and the first side surface SS1. The first side surface SS1 may be a lower side surface of the substrate SUB.

The second side surface SS2 may extend from the second chamfered surface CS2. The second chamfered surface CS2 may be disposed between the first surface FS and the second side surface SS2. The second side surface SS2 may be a left side surface of the substrate SUB.

The third side surface SS3 may extend from the third chamfered surface CS3. The third chamfered surface CS3 may be disposed between the first surface FS and the third side surface SS3. The third side surface SS3 may be an upper side surface of the substrate SUB.

The fourth side surface SS4 may extend from the fourth chamfered surface CS4. The fourth chamfered surface CS4 may be disposed between the first surface FS and the fourth side surface SS4. The fourth side surface SS4 may be a right side surface of the substrate SUB.

The plurality of pixels SP may be disposed on the first surface FS of the substrate SUB to display an image. The plurality of pixels SP may be arranged in a matrix form along the first direction (X-axis direction) and the second direction (Y-axis direction). A detailed description of the plurality of pixels SP will be described later in conjunction with FIGS. 3 and 4.

Figure 6:
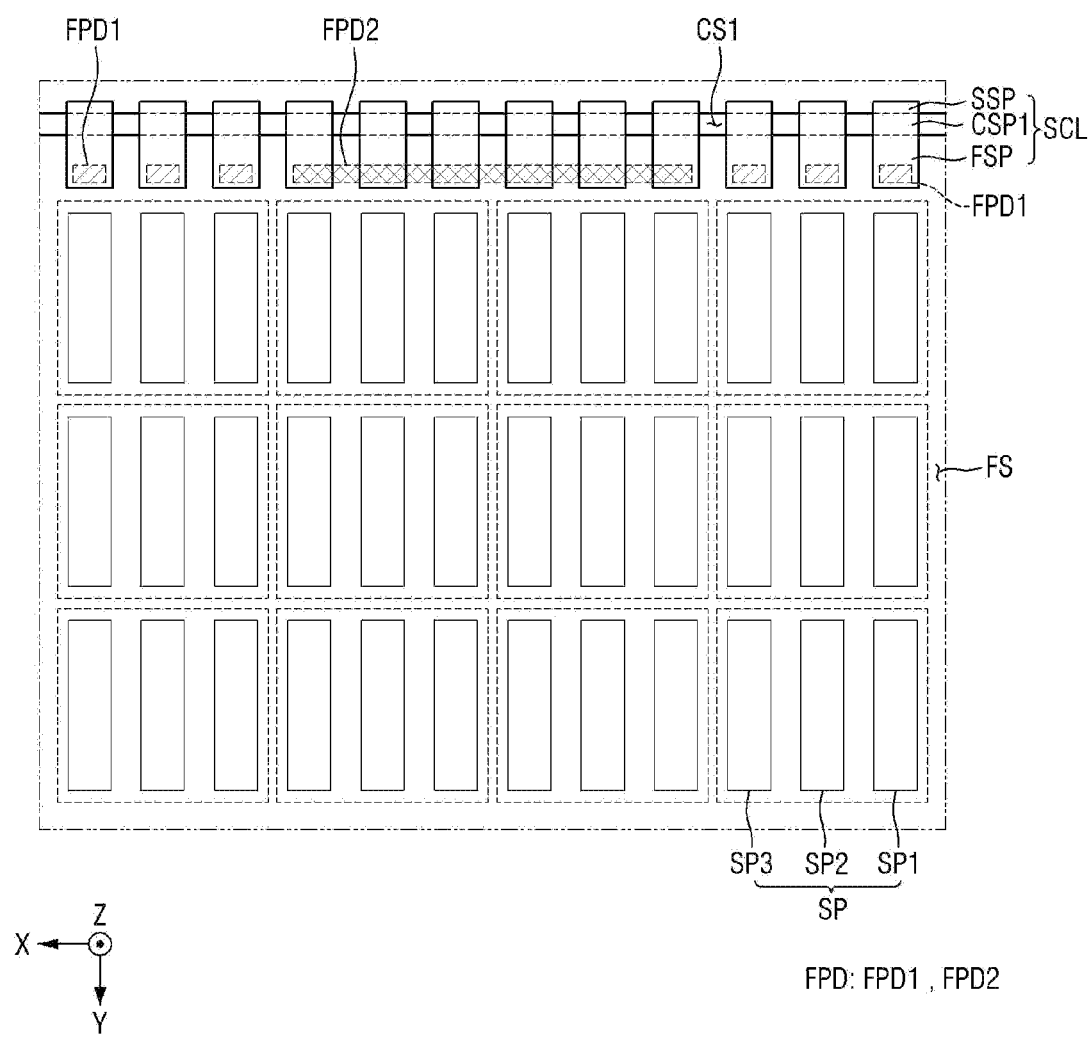
FIG. 6 is a plan view illustrating one side edge of the display device of FIG. 5.
Figure 7:
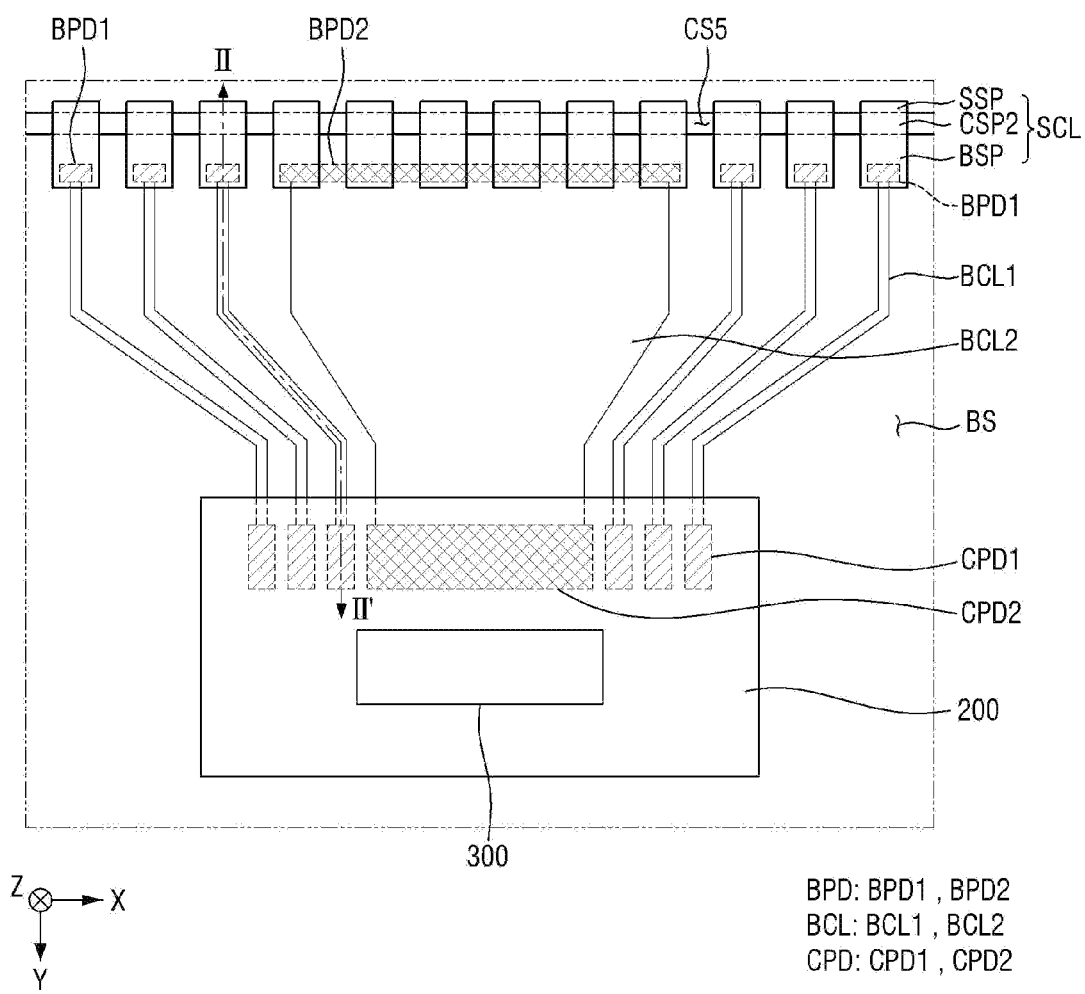
FIG. 7 is a rear view illustrating one side edge of the display device of FIG. 5.

Each of the plurality of side surface connection lines SCL may electrically connect a front pad part FPD of FIG. 6 disposed on the first surface FS and a rear pad part BPD of FIG. 7 disposed on the second surface BS. The front pad part may be connected to a data line, a power line, or a gate line connected to the pixel SP.

The plurality of side surface connection lines SCL may be disposed on the first surface FS, the second surface BS, at least two among the plurality of chamfered surfaces CS1 to CS8, and at least one among the plurality of side surfaces SS1 to SS4. For example, the plurality of side surface connection lines SCL may be disposed on the first surface FS, the second surface BS, the first chamfered surface CS1, the fifth chamfered surface CS5, and the first side surface SS1, and may electrically connect the front pad part FPD of FIG. 6 disposed on the first side of the first surface FS with the rear pad part BPD of FIG. 7 disposed on the first side of the second surface BS.

When the display panel 100 further includes the front pad part FPD of FIG. 6 disposed on the second side of the first surface FS of the substrate SUB and the rear pad part BPD of FIG. 7 disposed on the second side of the second surface BS, the plurality of side surface connection lines SCL may be further disposed on the first surface FS, the second surface BS, the second chamfered surface CS2, the sixth chamfered surface CS6, and the second side surface SS2. In addition, when the display panel 100 further includes the front pad part FPD of FIG. 6 disposed on the third side of the first surface FS of the substrate SUB and the rear pad part BPD of FIG. 7 disposed on the third side of the second surface BS, the plurality of side surface connection lines SCL may be further disposed on the first surface FS, the second surface BS, the third chamfered surface CS3, the seventh chamfered surface CS7, and the third side surface SS3. Further, when the display panel 100 further includes the front pad part FPD of FIG. 6 disposed on the fourth side of the first surface FS of the substrate SUB and the rear pad part BPD of FIG. 7 disposed on the fourth side of the second surface BS, the plurality of side surface connection lines SCL may be further disposed on the first surface FS, the second surface BS, the fourth chamfered surface CS4, the eighth chamfered surface CS8, and the fourth side surface SS4.

The circuit board 200 may be disposed on the second surface BS of the substrate SUB. The circuit board 200 may be electrically connected to the contact pad part CPD of FIG. 7 disposed on the second surface BS of the substrate SUB by using a conductive adhesive member such as an anisotropic conductive film. The contact pad part CPD of FIG. 7 is electrically connected to the rear pad part BPD of FIG. 7, so that the circuit board 200 may be electrically connected to the front pad part FPD of FIG. 6 through the side surface connection line SCL. The circuit board 200 may be a flexible printed circuit board, a printed circuit board, or a flexible film such as a chip on film.

The display driver 300 may generate a data voltage and supply the data voltage to a data line through the circuit board 200, the contact pad part CPD of FIG. 7, the rear pad part BPD of FIG. 7, the side surface connection line SCL, and the front pad part FPD of FIG. 6. The display driver 300 may be formed of an integrated circuit and may be attached to the circuit board 200. For another example, the display driver 300 may be directly attached to the second surface BS of the substrate SUB by using a chip on glass (COG) method.

The display device 10 includes the plurality of side surface connection lines SCL connecting the front pad part FPD of FIG. 6 disposed on the first surface FS with the rear pad part BPD of FIG. 7 disposed on the second surface BS, so that the flexible film disposed on the side surface of the substrate SUB may be omitted, and a bezel-less display device may be implemented.

Figure 3:
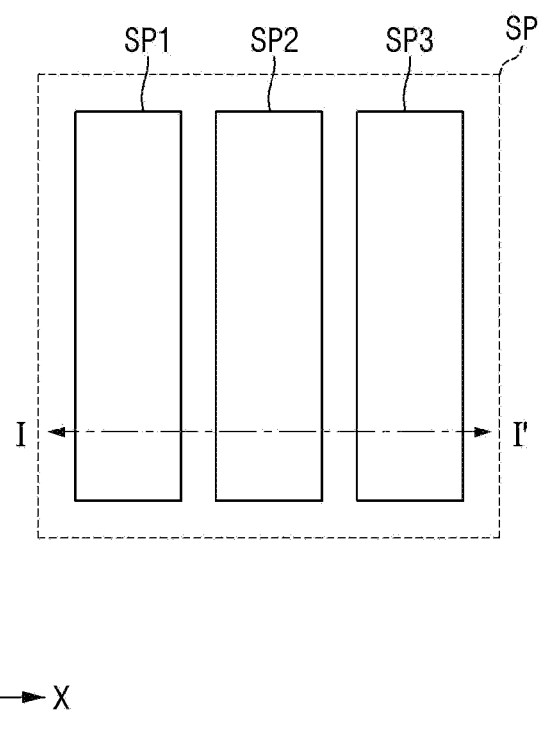
FIG. 3 is a view illustrating an example of a pixel of a display device according to one or more embodiments.
Figure 4:
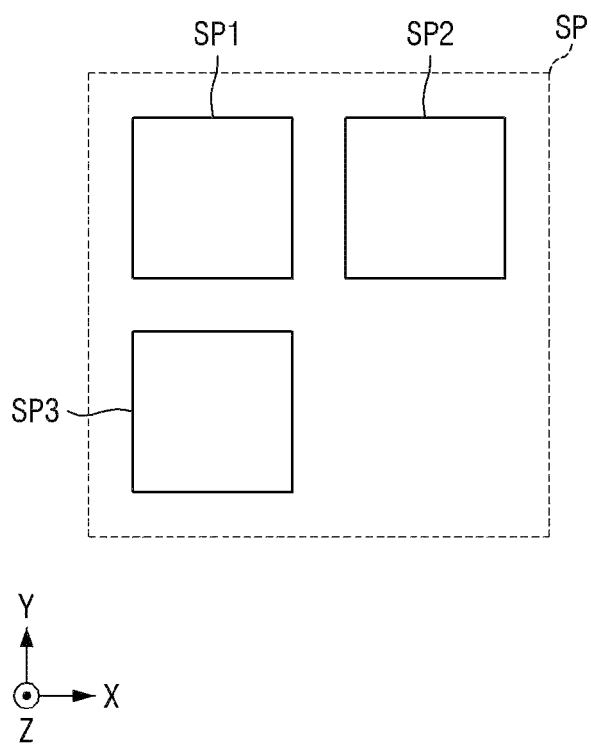
FIG. 4 is a view illustrating another example of a pixel of a display device according to one or more embodiments.

FIG. 3 is a view illustrating an example of a pixel of a display device according to one or more embodiments, and FIG. 4 is a view illustrating another example of a pixel of a display device according to one or more embodiments.

Referring to FIGS. 3 and 4, the pixel SP may include the first to third sub-pixels SP1, SP2, and SP3, but the number of sub-pixels forming one pixel SP is not limited thereto. Each of the first to third sub-pixels SP1, SP2, and SP3 may be connected to at least one data line and at least one gate line.

Each of the first to third sub-pixels SP1, SP2, and SP3 may have a rectangular, square, or rhombic shape in a plan view. For example, each of the first to third sub-pixels SP1, SP2, and SP3 may have a planar shape such as a rectangular shape having a short side in the first direction (X-axis direction) and a long side in the second direction (Y-axis direction), as illustrated in FIG. 3. For another example, each of the first to third sub-pixels SP1, SP2, and SP3 may have a planar shape such as a square shape or a rhombus including sides having the same length in the first direction (X-axis direction) and the second direction (Y-axis direction) as illustrated in FIG. 4.

In FIG. 3, the first to third sub-pixels SP1, SP2, and SP3 may be arranged along the first direction (X-axis direction). For another example, any one of the second and third sub-pixels SP2 and SP3 and the first sub-pixel SP1 may be arranged along the first direction (X-axis direction), and the other one and the first sub-pixel SP1 may be arranged along the second direction (Y-axis direction). In FIG. 4, the first and second sub-pixels SP1 and SP2 may be arranged along the first direction (X-axis direction), and the first and third sub-pixels SP1 and SP3 may be arranged along the second direction (Y-axis direction).

For yet another example, any one of the first and third sub-pixels SP1 and SP3 and the second sub-pixel SP2 may be arranged along the first direction (X-axis direction), and the other one and the second sub-pixel SP2 may be arranged along the second direction (Y-axis direction). For yet another example, any one of the first and second sub-pixels SP1 and SP2 and the third sub-pixel SP3 may be arranged along the first direction (X-axis direction), and the other one and the third sub-pixel SP3 may be arranged along the second direction (Y-axis direction).

The first sub-pixel SP1 may emit a first light, the second sub-pixel SP2 may emit a second light, and the third sub-pixel SP3 may emit a third light. For example, the first light may be light of a red wavelength band, the second light may be light of a green wavelength band, and the third light may be light of a blue wavelength band. The red wavelength band may be a wavelength band of about 600 nm to 750 nm, the green wavelength band may be a wavelength band of about 480 nm to 560 nm, and the blue wavelength band may be a wavelength band of about 370 nm to 460 nm, but the present disclosure is not limited thereto.

Each of the first to third sub-pixels SP1, SP2, and SP3 may include an inorganic light emitting element including an inorganic semiconductor as a light emitting element that emits light. For example, the inorganic light emitting element may be a micro light emitting diode (LED) of a flip chip type, but is not limited thereto.

For example, the area of the first sub-pixel SP1, the area of the second sub-pixel SP2, and the area of the third sub-pixel SP3 may be substantially the same, but the present disclosure is not limited thereto. For another example, at least one of the area of the first sub-pixel SP1, the area of the second sub-pixel SP2, and the area of the third sub-pixel SP3 may be different from another one. For yet another example, any two of the area of the first sub-pixel SP1, the area of the second sub-pixel SP2, and the area of the third sub-pixel SP3 may be substantially the same, and the other one may be different from the two. For yet another example, the area of the first sub-pixel SP1, the area of the second sub-pixel SP2, and the area of the third sub-pixel SP3 may be different from each other.

Figure 5:
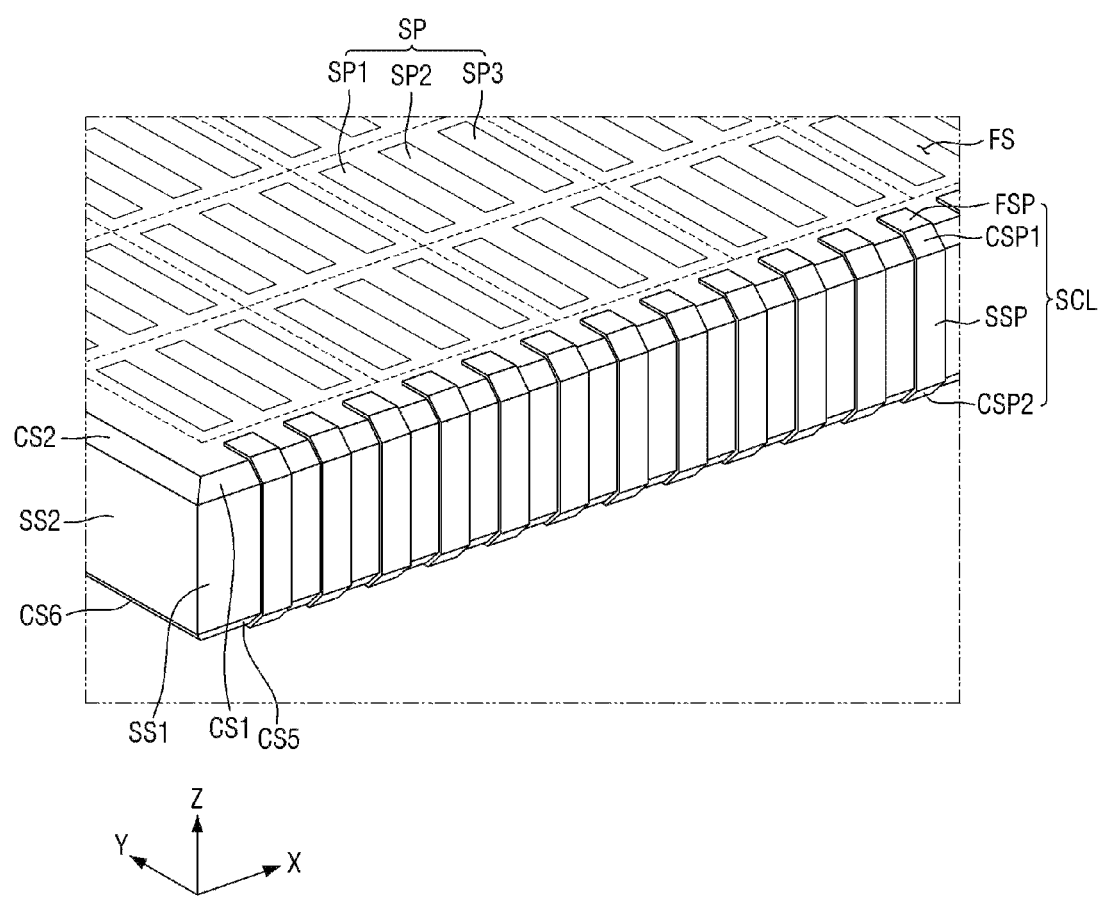
FIG. 5 is a perspective view illustrating one side edge of the display device according to one or more embodiments.

FIG. 5 is a perspective view illustrating one side edge of the display device according to one or more embodiments, FIG. 6 is a plan view illustrating one side edge of the display device of FIG. 5, and FIG. 7 is a rear view illustrating one side edge of the display device of FIG. 5.

Referring to FIGS. 5 to 7, the display panel 100 may further include the front pad part FPD, the rear pad part BPD, the contact pad part CPD, and a rear surface connection line BCL.

The front pad part FPD may be a pad part disposed on the first surface FS corresponding to the front surface of the substrate SUB. The front pad part FPD may be disposed at an edge of the first side of the first surface FS of the substrate SUB. The front pad part FPD may be arranged along the first direction (X-axis direction). The front pad part FPD may include first and second front pad parts FPD1 and FPD2.

The first front pad part FPD1 may be electrically connected to a first rear pad part BPD1 through the side surface connection line SCL. One first front pad part FPD1 may be connected to one side surface connection line SCL. For example, the first front pad part FPD1 may be connected to a data line of the display panel 100 to supply a data voltage.

The second front pad part FPD2 may be electrically connected to the second rear pad part BPD2 through the plurality of side surface connection lines SCL. The second front pad part FPD2 may be adjacent to the first front pad part FPD1 in the first direction (X-axis direction). The first and second front pad parts FPD1 and FPD2 may be disposed on the same extension line. One second front pad part FPD2 may be connected to the plurality of side surface connection lines SCL. For example, the second front pad part FPD2 may be connected to a power line or a power electrode of the display panel 100 to supply a power voltage. Here, the power voltage may be a high potential voltage or a low potential voltage for driving the pixel SP, but is not limited thereto.

An area of the second front pad part FPD2 may be larger than an area of the first front pad part FPD1. The first front pad part FPD1 may be an individual pad, and the second front pad part FPD2 may be a cylindrical pad, but the present disclosure is not limited thereto. For example, the area of the second front pad part FPD2 may be several to several hundred times the area of the first front pad part FPD1. Because the second front pad part FPD2 has a relatively large area, pad resistance may be relatively reduced. Accordingly, the display device 10 may improve the power transmission efficiency to improve the quality, and may prevent a dark line defect although some of the plurality of side surface connection lines SCL connected to the second front pad part FPD2 are disconnected.

The rear pad part BPD may be a pad part disposed on the second surface BS corresponding to the rear surface of the substrate SUB. The rear pad part BPD may be disposed at an edge of the first side of the second surface BS of the substrate SUB. The rear pad part BPD may be arranged along the first direction (X-axis direction). The rear pad part BPD may include first and second rear pad parts BPD1 and BPD2.

The first rear pad part BPD1 may be electrically connected to the first front pad part FPD1 through the side surface connection line SCL. The first rear pad part BPD1 may be electrically connected to a first contact pad part CPD1 through a first rear surface connection line BCL1. One first rear pad part BPD1 may be connected to one side surface connection line SCL. One first rear pad part BPD1 may be connected to one first rear surface connection line BCL1. For example, the first rear pad part BPD1 may supply a data voltage received from the display driver 300 to the first front pad part FPD1.

The second rear pad part BPD2 may be electrically connected to the second front pad part FPD2 through the plurality of side surface connection lines SCL. The second rear pad part BPD2 may be electrically connected to a second contact pad part CPD2 through a second rear surface connection line BCL2. The second rear pad part BPD2 may be adjacent to the first rear pad part BPD1 in the first direction (X-axis direction). The first and second rear pad parts BPD1 and BPD2 may be disposed on the same extension line. One second rear pad part BPD2 may be connected to the plurality of side surface connection lines SCL. One second rear pad part BPD2 may be connected to one second rear surface connection line BCL2, but is not limited thereto. For another example, one second rear pad part BPD2 may be connected to a plurality of second rear surface connection lines BCL2. The second rear pad part BPD2 may supply the power voltage received from the display driver 300 to the second front pad part FPD2.

An area of the second rear pad part BPD2 may be larger than an area of the first rear pad part BPD1. The first rear pad part BPD1 may be an individual pad, and the second rear pad part BPD2 may be a cylindrical pad, but the present disclosure is not limited thereto. For example, the area of the second rear pad part BPD2 may be several to several hundred times the area of the first rear pad part BPD1. Because the second rear pad part BPD2 has a relatively large area, pad resistance may be relatively reduced. Accordingly, the display device 10 may improve the power transmission efficiency to improve the quality, and may prevent a dark line defect although some of the plurality of side surface connection lines SCL connected to the second rear pad part BPD2 are disconnected.

The contact pad part CPD may be a pad part disposed on the second surface BS of the substrate SUB. The contact pad part CPD may be disposed adjacent to the center of the second surface BS of the substrate SUB compared to the rear pad part BPD. The contact pad parts CPD may be arranged along the first direction (X-axis direction). The gap between the contact pad parts CPD adjacent to each other in the first direction (X-axis direction) may be smaller than the gap between the rear pad parts BPD adjacent to each other in the first direction (X-axis direction), and a larger number of the contact pad parts CPD may be connected to the circuit board 200. The contact pad part CPD may include the first and second contact pad parts CPD1 and CPD2.

The first contact pad part CPD1 may be electrically connected to the circuit board 200 through a conductive adhesive member. For example, the first contact pad part CPD1 may supply a data voltage received from the display driver 300 to the first rear pad part BPD1.

The second contact pad part CPD2 may be electrically connected to the circuit board 200 through a conductive adhesive member. The second contact pad part CPD2 may be adjacent to the first contact pad part CPD1 in the first direction (X-axis direction). The first and second contact pad parts CPD1 and BPD2 may be disposed on the same extension line. For example, the second contact pad part CPD2 may supply a power voltage received from the display driver 300 to the second rear pad part BPD2.

An area of the second contact pad part CPD2 may be larger than an area of the first contact pad part CPD1. The first contact pad part CPD1 may be an individual pad, and the second contact pad part CPD2 may be a cylindrical pad, but the present disclosure is not limited thereto. For example, the area of the second contact pad part CPD2 may be several to several hundred times the area of the first contact pad part CPD1. Because the second contact pad part CPD2 has a relatively large area, pad resistance may be relatively reduced. Accordingly, the display device 10 may improve power transmission efficiency to improve quality.

The rear surface connection line BCL may electrically connect the rear pad part BPD with the contact pad part CPD. The rear surface connection line BCL may be integrally formed with the rear pad part BPD and the contact pad part CPD. The rear pad part BPD, the contact pad part CPD, and the rear surface connection line BCL may be formed as a single layer or multiple layers made of any one of molybdenum (Mo), aluminum (Al), chromium (Cr), gold (Au), titanium (Ti), nickel (Ni), neodymium (Nd), and copper (Cu), or an alloy thereof. The rear surface connection line BCL may include the first and second rear surface connection lines BCL1 and BCL2.

The first rear surface connection line BCL1 may electrically connect the first rear pad part BPD1 with the first contact pad part CPD1, and the second rear surface connection line BCL2 may electrically connect the second rear pad part BPD2 with the second contact pad part CPD2. A width of the second rear surface connection line BCL2 may be greater than a width of the first rear surface connection line BCL1. The first rear surface connection line BCL1 may be an individual line, and the second rear surface connection line BCL2 may be a cylindrical line, but the present disclosure is not limited thereto. For example, the width of the second rear surface connection line BCL2 may be several to several hundred times the width of the first rear surface connection line BCL1. Because the second rear surface connection line BCL2 has a relatively large width, line resistance may be relatively reduced. Accordingly, the display device 10 may improve power transmission efficiency to improve quality.

The side surface connection line SCL may include a front portion FSP, a first chamfer portion CSP1, a side portion SSP, a second chamfer portion CSP2, and a rear portion BSP.

The front portion FSP may be disposed on the first surface FS of the substrate SUB. The front portion FSP may be disposed on the front pad part FPD to completely cover the front pad part FPD. The front portion FSP may be connected to the front pad part FPD.

The first chamfer portion CSP1 may be disposed on the first chamfered surface CS1 of the substrate SUB. The first chamfer portion CSP1 may be disposed between the front portion FSP and the side portion SSP.

The side portion SSP may be disposed on the first side surface SS1 of the substrate SUB. The side portion SSP may be disposed between the first chamfer portion CSP1 and the second chamfer portion CSP2.

The second chamfer portion CSP2 may be disposed on the fifth chamfered surface CS5 of the substrate SUB. The second chamfer portion CSP2 may be disposed between the side portion SSP and the rear portion BSP.

The rear portion BSP may be disposed on the second surface BS of the substrate SUB. The rear portion BSP may be disposed on the rear pad part BPD to completely cover the rear pad part BPD. The rear portion BSP may be connected to the rear pad part BPD.

The side surface connection line SCL may include metal powder including metal particles such as silver (Ag) and copper (Cu) and a polymer such as an acrylic resin or an epoxy resin. The side surface connection line SCL may have conductivity by including the metal powder, and may serve as a binder connecting the metal particles by including the polymer.

For example, the side surface connection line SCL may be formed by printing a metal paste containing metal particles, a monomer, and a solvent on the substrate SUB using a silicon pad and then sintering using a laser. The side surface connection line SCL may have a lower specific resistance as the metal particles adhere to each other and agglomerate while the monomer reacts to the polymer by the heat generated by the laser in the sintering process.

Figure 8:
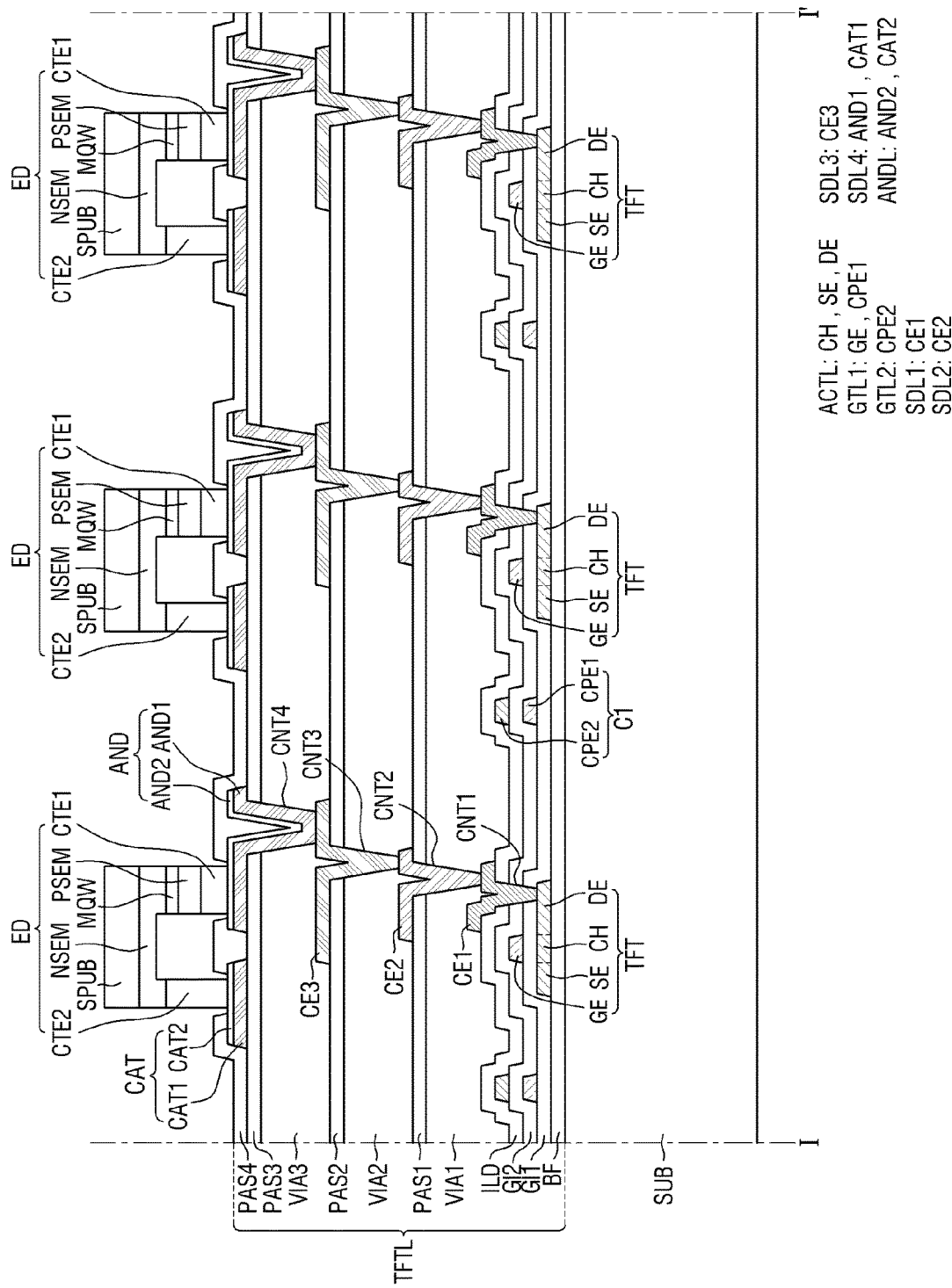
FIG. 8 is a cross-sectional view taken along the line I-I' of FIG. 3.
Figure 9:
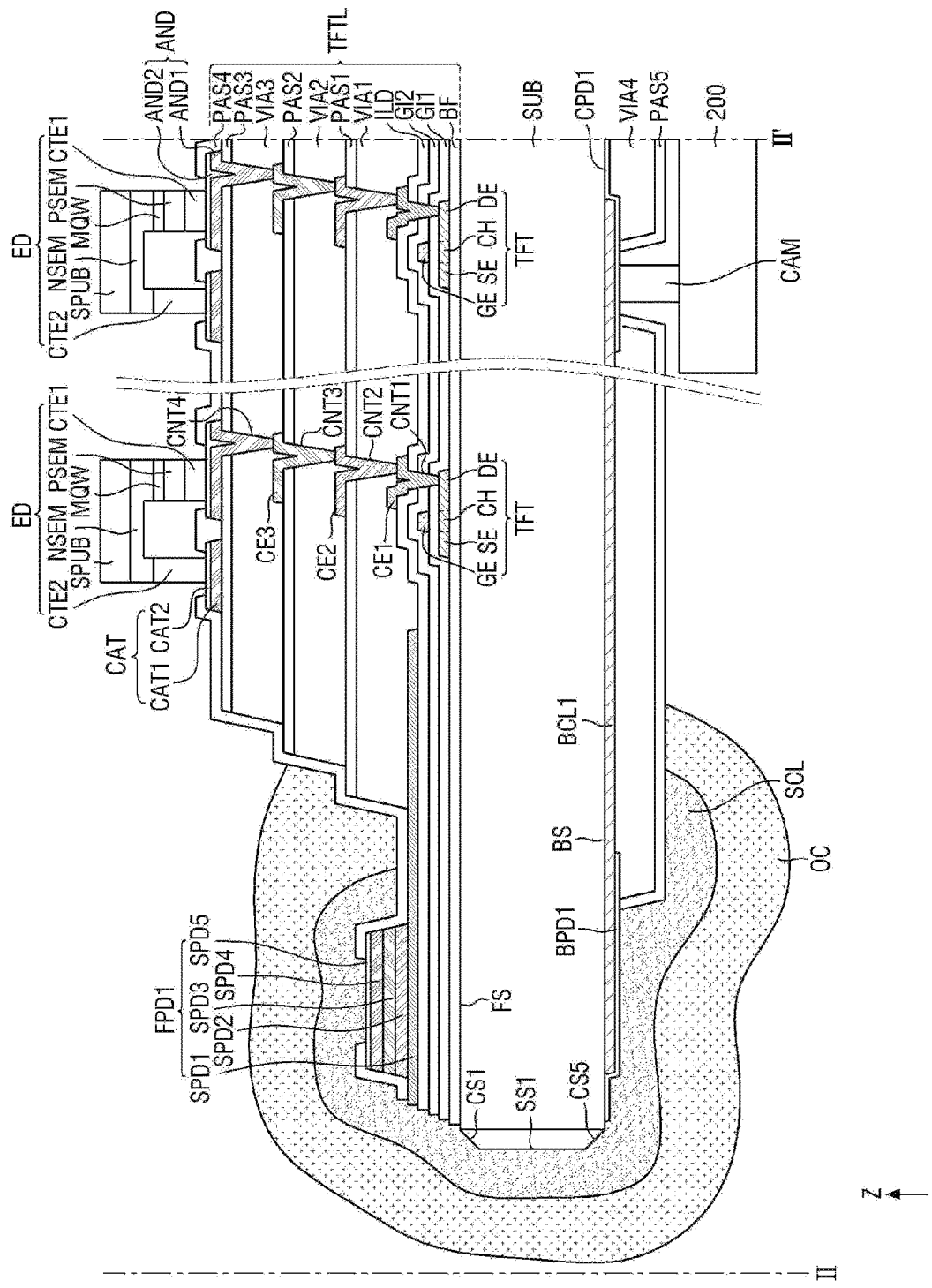
FIG. 9 is a cross-sectional view taken along the line II-II' of FIG. 7.

FIG. 8 is a cross-sectional view taken along the line I-I' of FIG. 3, and FIG. 9 is a cross-sectional view taken along the line II-II' of FIG. 7.

Referring to FIGS. 8 and 9, the display device 10 may include the substrate SUB, a buffer layer BF, an active layer ACTL, a first gate insulating layer GI1, a first gate layer GTL1, and a second gate Insulating layer GI2, second gate layer GTL2, an interlayer insulating layer ILD, a first source metal layer SDL1, a first via layer VIA1, a first passivation layer PAS1, a second source metal layer SDL2, a second via layer VIA2, a second passivation layer PAS2, a third source metal layer SDL3, a third via layer VIA3, a third passivation layer PAS3, a fourth source metal layer SDL4, an anode layer ANDL, a fourth passivation layer PAS4, the first front pad part FPD1, the side surface connection line SCL, the first rear pad part BPD1, the first contact pad part CPD1, a fourth via layer VIA4, a fifth passivation layer PAS5, and the circuit board 200.

The substrate SUB may support the display device 10. The substrate SUB may be a base substrate or a base member. The substrate SUB may be a flexible substrate which can be bent, folded, or rolled. For example, the substrate SUB may include an insulating material such as a polymer resin such as polyimide (PI), but the present disclosure is not limited thereto. For another example, the substrate SUB may be a rigid substrate including a glass material.

The buffer layer BF may be disposed on the substrate SUB. The buffer layer BF may include an inorganic material capable of preventing permeation of air or moisture. The buffer layer BF may include a plurality of inorganic layers that are alternately stacked. For example, the buffer layer BF may be a multilayer in which one or more inorganic layers of a silicon nitride layer, a silicon oxynitride layer, a silicon oxide layer, a titanium oxide layer, and an aluminum oxide layer are alternately stacked.

The active layer ACTL may be disposed on the buffer layer BF. The active layer ACTL may include a channel CH, a source electrode SE, and a drain electrode DE of a thin film transistor TFT. Here, the thin film transistor TFT may be a transistor constituting a pixel circuit. The source electrode SE and the drain electrode DE may be made to be conductive by performing heat treatment on the active layer ACTL. For example, the active layer ACTL may include polycrystalline silicon, monocrystalline silicon, low-temperature polycrystalline silicon, amorphous silicon, or an oxide semiconductor. For another example, the active layer ACTL may include first and second active layers disposed on different layers. In this case, the first active layer may include polycrystalline silicon, monocrystalline silicon, low-temperature polycrystalline silicon, or amorphous silicon, and the second active layer may include an oxide semiconductor.

The first gate insulating layer GI1 may be disposed on the active layer ACTL and the buffer layer BF. The first gate insulating layer GI1 may insulate a gate electrode GE and the channel CH of the thin film transistor TFT. The first gate insulating layer GI1 may include an inorganic layer. For example, the first gate insulating layer GI1 may include one of a silicon nitride layer, a silicon oxynitride layer, a silicon oxide layer, a titanium oxide layer, and an aluminum oxide layer.

The first gate layer GTL1 may be disposed on the first gate insulating layer GI1. The first gate layer GTL1 may include the gate electrode GE of the thin film transistor TFT, and a first capacitor electrode CPE1 of a first capacitor C1. The first gate layer GTL1 may be a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second gate insulating layer GI2 may be disposed on the first gate layer GTL1 and the first gate insulating layer GI1. The second gate insulating layer GI2 may insulate the first gate layer GTL1 and the second gate layer GTL2. The second gate insulating layer GI2 may include an inorganic layer. For example, the second gate insulating layer GI2 may include one of a silicon nitride layer, a silicon oxynitride layer, a silicon oxide layer, a titanium oxide layer, and an aluminum oxide layer.

The second gate layer GTL2 may be disposed on the second gate insulating layer GI2. The second gate layer GTL2 may include a second capacitor electrode CPE2 of the first capacitor C1. The second gate layer GTL2 may be a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The interlayer insulating layer ILD may be disposed on the second gate layer GTL2 and the second gate insulating layer GI2. The interlayer insulating layer ILD may insulate the first source metal layer SDL1 and the second gate layer GTL2. The interlayer insulating layer ILD may include an inorganic layer. For example, the interlayer insulating layer ILD may include one of a silicon nitride layer, a silicon oxynitride layer, a silicon oxide layer, a titanium oxide layer, and an aluminum oxide layer.

The first source metal layer SDL1 may be disposed on the interlayer insulating layer ILD. The first source metal layer SDL1 may include a first connection electrode CE1. The first connection electrode CE1 may be connected to a second connection electrode CE2 penetrating the first passivation layer PAS1 and the first via layer VIA1. The first connection electrode CE1 may be connected to the drain electrode DE of the thin film transistor TFT while penetrating the interlayer insulating layer ILD, the second gate insulating layer GI2, and the first gate insulating layer GI1. Accordingly, the first connection electrode CE1 may electrically connect the second connection electrode CE2 with the drain electrode DE. The first source metal layer SDL1 may be a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The first via layer VIA1 may be disposed on the first source metal layer SDL1 and the interlayer insulating layer ILD. The first via layer VIA1 may flatten the upper end of the first source metal layer SDL1. The first via layer VIA1 may include an organic layer such as an acryl resin, an epoxy resin, a phenolic resin, a polyamide resin, a polyimide resin, or the like.

The first passivation layer PAS1 may be disposed on the first via layer VIA1 to protect the first source metal layer SDL1. The first passivation layer PAS1 may include an inorganic layer. For example, the first passivation layer PAS1 may include one of a silicon nitride layer, a silicon oxynitride layer, a silicon oxide layer, a titanium oxide layer, and an aluminum oxide layer.

The second source metal layer SDL2 may be disposed on the first via layer VIA1 and the first passivation layer PAS1. The second source metal layer SDL2 may include the second connection electrode CE2. The second connection electrode CE2 may be connected to the third connection electrode CE3 penetrating the second passivation layer PAS2 and the second via layer VIA2. The second connection electrode CE2 may penetrate the first passivation layer PAS1 and the first via layer VIA1 to be connected to the first connection electrode CE1. Accordingly, the second connection electrode CE2 may electrically connect the third connection electrode CE3 with the first connection electrode CE1. The second source metal layer SDL2 may be a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second via layer VIA2 may be disposed on the second source metal layer SDL2 and the first passivation layer PAS1. The second via layer VIA2 may flatten the upper end of the second source metal layer SDL2. The second via layer VIA2 may include an organic layer such as an acryl resin, an epoxy resin, a phenolic resin, a polyamide resin, a polyimide resin, or the like.

The second passivation layer PAS2 may be disposed on the second via layer VIA2 to protect the second source metal layer SDL2. The second passivation layer PAS2 may include an inorganic layer. For example, the second passivation layer PAS2 may include one of a silicon nitride layer, a silicon oxynitride layer, a silicon oxide layer, a titanium oxide layer, and an aluminum oxide layer.

The third source metal layer SDL3 may be disposed on the second via layer VIA2 and the second passivation layer PAS2. The third source metal layer SDL3 may include the third connection electrode CE3. The third connection electrode CE3 may be connected to a first pixel electrode AND1 penetrating the third passivation layer PAS3 and the third via layer VIA3. The third connection electrode CE3 may penetrate the second passivation layer PAS2 and the second via layer VIA2 to be connected to the second connection electrode CE2. Accordingly, the third connection electrode CE3 may electrically connect the first pixel electrode AND1 with the second connection electrode CE2. The third source metal layer SDL3 may be a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The third via layer VIA3 may be disposed on the third source metal layer SDL3 and the second passivation layer PAS2. The third via layer VIA3 may flatten the upper end of the third source metal layer SDL3. The third via layer VIA3 may include an organic layer such as an acryl resin, an epoxy resin, a phenolic resin, a polyamide resin, a polyimide resin, or the like.

The third passivation layer PAS3 may be disposed on the third via layer VIA3 to protect the third source metal layer SDL3. The third passivation layer PAS3 may include an inorganic layer. For example, the third passivation layer PAS3 may include one of a silicon nitride layer, a silicon oxynitride layer, a silicon oxide layer, a titanium oxide layer, and an aluminum oxide layer.

The fourth source metal layer SDL4 may be disposed on the third passivation layer PAS3. The fourth source metal layer SDL4 may include the first pixel electrode AND1 and a first cathode electrode CAT1. The first pixel electrode AND1 may be connected to the third connection electrode CE3 while penetrating the third passivation layer PAS3 and the third via layer VIA3. The fourth source metal layer SDL4 may be a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The anode layer ANDL may be disposed on the fourth source metal layer SDL4. The anode layer ANDL may include a second pixel electrode AND2 and a second cathode electrode CAT2. The anode layer ANDL may include a transparent conductive material (TCO) such as indium tin oxide (ITO), indium zinc oxide (IZO), and indium tin zinc oxide (ITZO).

The fourth passivation layer PAS4 may be disposed on the third via layer VIA3, the third passivation layer PAS3, the edge of the pixel electrode AND, the edge of the cathode electrode CAT, and the edge of the first front pad part FPD1. The fourth passivation layer PAS4 may include an inorganic layer. For example, the fourth passivation layer PAS4 may include one of a silicon nitride layer, a silicon oxynitride layer, a silicon oxide layer, a titanium oxide layer, and an aluminum oxide layer. The fourth passivation layer PAS4 may expose a part of the top surface of the pixel electrode AND without covering it. The fourth passivation layer PAS4 may expose a portion of the top surface of the cathode electrode CAT and not cover the entirety.

The pixel electrode AND may receive a driving current from the pixel circuit, and the light emitting element ED may emit light having a desired luminance (e.g., a predetermined luminance) based on a magnitude of the driving current and a period in which the driving current flows.

The light emitting element ED may be connected between the pixel electrode AND and the cathode electrode CAT. The light emitting element ED may be disposed on the anode layer ANDL. The light emitting element ED may be the micro light emitting diode (micro LED) of a flip chip type in which a first contact electrode CTE1 is connected to the pixel electrode AND and a second contact electrode CTE2 is connected to the cathode electrode CAT, but is not limited thereto. The light emitting element ED may include an inorganic material such as GaN. In the light emitting element ED, each of the length thereof in the first direction (X-axis direction), the length thereof in the second direction (Y-axis direction), and the length thereof in the third direction (Z-axis direction) may be several to several hundred μm. For example, in the light emitting element ED, each of the length thereof in the first direction (X-axis direction), the length thereof in the second direction (Y-axis direction), and the length thereof in the third direction (Z-axis direction) may be about 100 μm or less.

The light emitting element ED may be formed by growing on a semiconductor substrate such as a silicon wafer. For example, the plurality of light emitting elements ED may be moved onto the pixel electrode AND and the cathode electrode CAT of the substrate SUB on the silicon wafer. For another example, the plurality of light emitting elements ED may be moved onto the pixel electrode AND and the cathode electrode CAT through an electrostatic method using an electrostatic head or a stamp method using an elastic polymer material such as polydimethylsiloxane (PDMS) or silicon as a transfer substrate.

The light emitting element ED may be a light emitting structure including a base substrate SPUB, an n-type semiconductor NSEM, an active layer MQW, a p-type semiconductor PSEM, the first contact electrode CTE1, and the second contact electrode CTE2. For example, the base substrate SPUB may be a sapphire substrate, but is not limited thereto.

An n-type semiconductor NSEM may be disposed on one surface of the base substrate SPUB. For example, the n-type semiconductor NSEM may be disposed on the bottom surface of the base substrate SPUB. The n-type semiconductor NSEM may include GaN doped with an n-type conductivity-type dopant such as Si, Ge, and Sn.

The active layer MQW may be disposed on a portion of one surface of the n-type semiconductor NSEM. The active layer MQW may include a material having a single or multiple quantum well structure. When the active layer MQW contains a material having a multiple quantum well structure, the active layer MQW may have the structure in which a plurality of well layers and barrier layers are alternately laminated. For example, the well layer may include InGaN, and the barrier layer may include GaN or AlGaN, but the present disclosure is not limited thereto. For another example, the active layer MQW may have a structure in which a semiconductor material having a large band gap energy and a semiconductor material having a low band gap energy are alternately stacked. For yet another example, the active layer MQW may include different Group III to Group V semiconductor materials depending on the wavelength band of the emitted light.

The p-type semiconductor PSEM may be disposed on one surface of the active layer MQW. The p-type semiconductor PSEM may include GaN doped with a p-type conductivity-type dopant such as Mg, Zn, Ca, Se, and Ba.

The first contact electrode CTE1 may be disposed on one surface of the p-type semiconductor PSEM, and the second contact electrode CTE2 may be disposed on another portion of one surface of the n-type semiconductor NSEM. The second contact electrode CTE2 may be spaced from the active layer MQW.

The first contact electrode CTE1 and the pixel electrode AND may be adhered to each other through a conductive adhesive member such as an anisotropic conductive film or an anisotropic conductive paste. For another example, the first contact electrode CTE1 and the pixel electrode AND may be adhered to each other through a soldering process. The second contact electrode CTE2 and the cathode electrode CAT may be adhered to each other through a conductive adhesive member or a soldering process.

The first front pad part FPD1 may include first to fifth portions SPD1, SPD2, SPD3, SPD4, and SPD5. The first portion SPD1 may be formed of the same material as the first connection electrode CE1 of the first source metal layer SDL1 in the same process. The second portion SPD2 may be disposed on the first portion SPD1. The second portion SPD2 may be formed of the same material as the second connection electrode CE2 of the second source metal layer SDL2 in the same process. The third portion SPD3 may be disposed on the second portion SPD2. The third portion SPD3 may be formed of the same material as the third connection electrode CE3 of the third source metal layer SDL3 in the same process. The fourth portion SPD4 may be disposed on the third portion SPD3. The fourth portion SPD4 may be formed of the same material as the first pixel electrode AND1 of the fourth source metal layer SDL4 in the same process. The fifth portion SPD5 may be disposed on the fourth portion SPD4. The fifth portion SPD5 may be formed of the same material as the second pixel electrode AND2 of the anode layer ANDL in the same process. The fourth passivation layer PAS4 may be disposed on an edge of the first front pad part FPD1 and may be opened on a portion of the top surface of the first front pad part FPD1. The first front pad part FPD1 may be exposed by the fourth passivation layer PAS4 to be connected to the side surface connection line SCL.

The side surface connection line SCL may be disposed on a side surface of the display device 10. The side surface connection line SCL may cover a rear surface edge of the display device 10, a side surface of the display device 10, and a top surface edge of the display device 10. One end of the side surface connection line SCL may be connected to the first rear pad part BPD1, and the other end of the side surface connection line SCL may be connected to the first front pad part FPD1. The side surface connection line SCL may pass through the fourth via layer VIA4, the fifth passivation layer PAS5, the substrate SUB, the buffer layer BF, the first and second gate insulating layers GI1 and GI2, the interlayer insulating layer ILD, and the side surface of the fourth passivation layer PAS4.

The first rear pad part BPD1 may be disposed on the rear surface of the substrate SUB. The first rear pad part BPD1 may be electrically connected to the first front pad part FPD1 through the side surface connection line SCL. The first rear pad part BPD1 may be electrically connected to the first contact pad part CPD1 through the first rear surface connection line BCL1.

The first contact pad part CPD1 may be integrally formed with the first rear pad part BPD1 and the first rear surface connection line BCL1. The first contact pad part CPD1, the first rear pad part BPD1, and the first rear surface connection line BCL1 may be formed as a single layer or multiple layers made of any one of molybdenum (Mo), aluminum (Al), chrome (Cr), gold (Au), titanium (Ti), nickel (Ni), neodymium (Nd), and copper (Cu), or an alloy thereof.

The fourth via layer VIA4 may cover the first rear surface connection line BCL1, and may expose the first contact pad part CPD1 and the first rear pad part BPD1. The fourth via layer VIA4 may planarize the rear surface of the substrate SUB. The fourth via layer VIA4 may include an organic layer such as acryl resin, epoxy resin, phenolic resin, polyamide resin, polyimide resin, or the like.

The fifth passivation layer PAS5 may be disposed on the rear surface of the fourth via layer VIA4 to protect the first contact pad part CPD1, the first rear pad part BPD1, and the first rear surface connection line BCL1. The fifth passivation layer PAS5 may include an inorganic layer. For example, the fifth passivation layer PAS5 may include one of a silicon nitride layer, a silicon oxynitride layer, a silicon oxide layer, a titanium oxide layer, and an aluminum oxide layer.

An overcoat layer OC may be disposed on the first surface FS, the first chamfered surface CS1, the first side surface SS1, the fifth chamfered surface CS5, and the second surface BS of the substrate SUB. The overcoat layer OC may cover the side surface connection line SCL. The overcoat layer OC may include an organic layer such as acryl resin, epoxy resin, phenolic resin, polyamide resin, polyimide resin and the like.

The circuit board 200 may be disposed on the rear surface of the fifth passivation layer PAS5. The circuit board 200 may be attached to the fifth passivation layer PAS5 by using a conductive adhesive member such as an anisotropic conductive film. The circuit board 200 may supply a voltage or a signal to the first front pad part FPD1 disposed on the first surface FS of the substrate SUB through the first contact pad part CPD1, the first rear surface connection line BCL1, the first rear pad part BPD1, and the side surface connection line SCL. The circuit board 200 may mount the display driver 300 on the rear surface of the substrate SUB. The circuit board 200 may transmit a signal of the display driver 300 to the pixels SP.

A connection film CAM may attach the circuit board 200 to the first contact pad part CPD1. For example, the connection film CAM may include an anisotropic conductive film. When the connection film CAM includes the anisotropic conductive film, the connection film CAM may have conductivity in an area in which the first contact pad part CPD1 and the circuit board 200 are in contact with the connection film CAM, and may electrically connect the circuit board 200 to the first contact pad part CPD1.

The display device 10 includes the first rear pad part BPD1 disposed on the second surface BS of the substrate SUB, the first front pad part FPD1 disposed on the first surface FS of the substrate SUB, and the side surface connection line SCL electrically connecting the first rear pad part BPD1 with the first front pad part FPD1, so that the flexible film disposed on the side surface of the substrate SUB may be omitted, and a bezel-less display device may be implemented.

Figure 10:
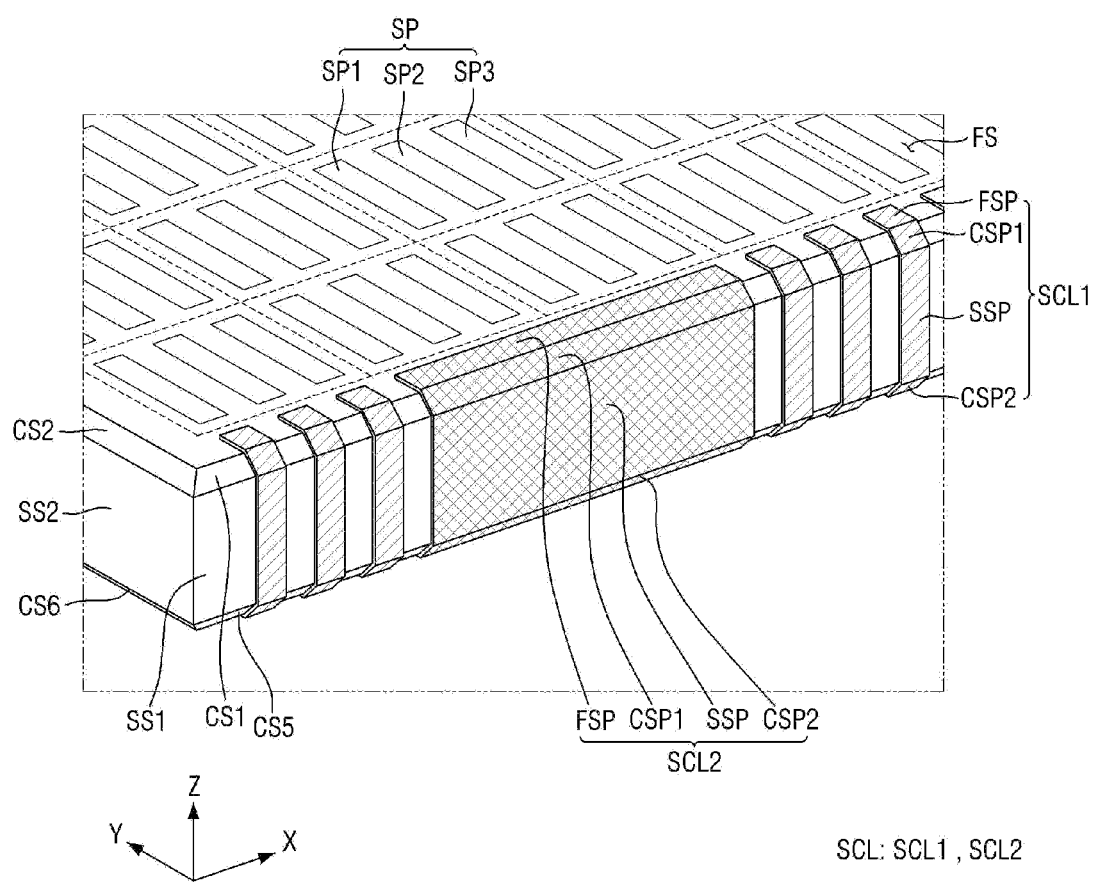
FIG. 10 is a perspective view illustrating one side edge of a display device according to one or more embodiments.
Figure 11:
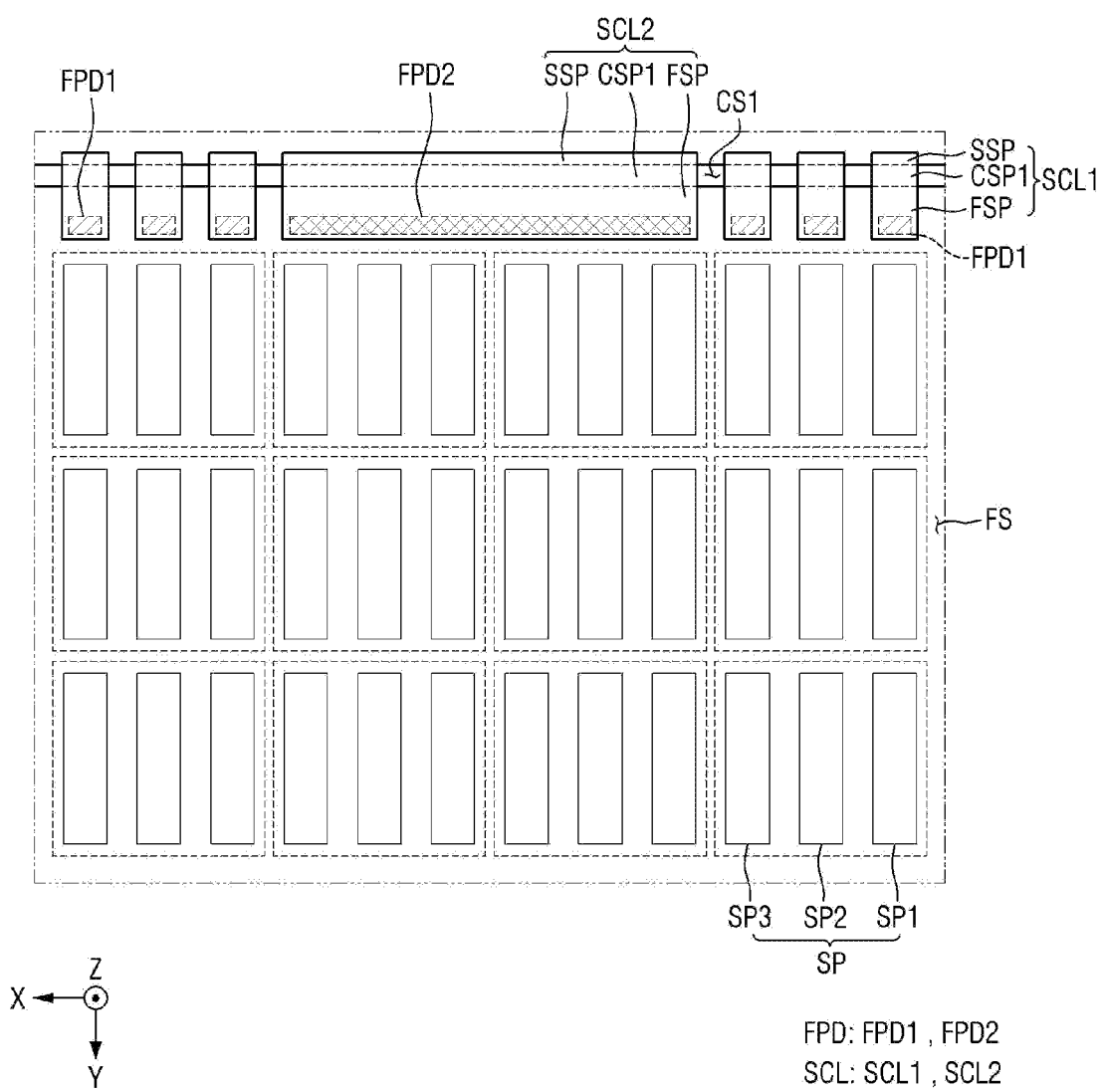
FIG. 11 is a plan view illustrating one side edge of the display device of FIG. 10.
Figure 12:
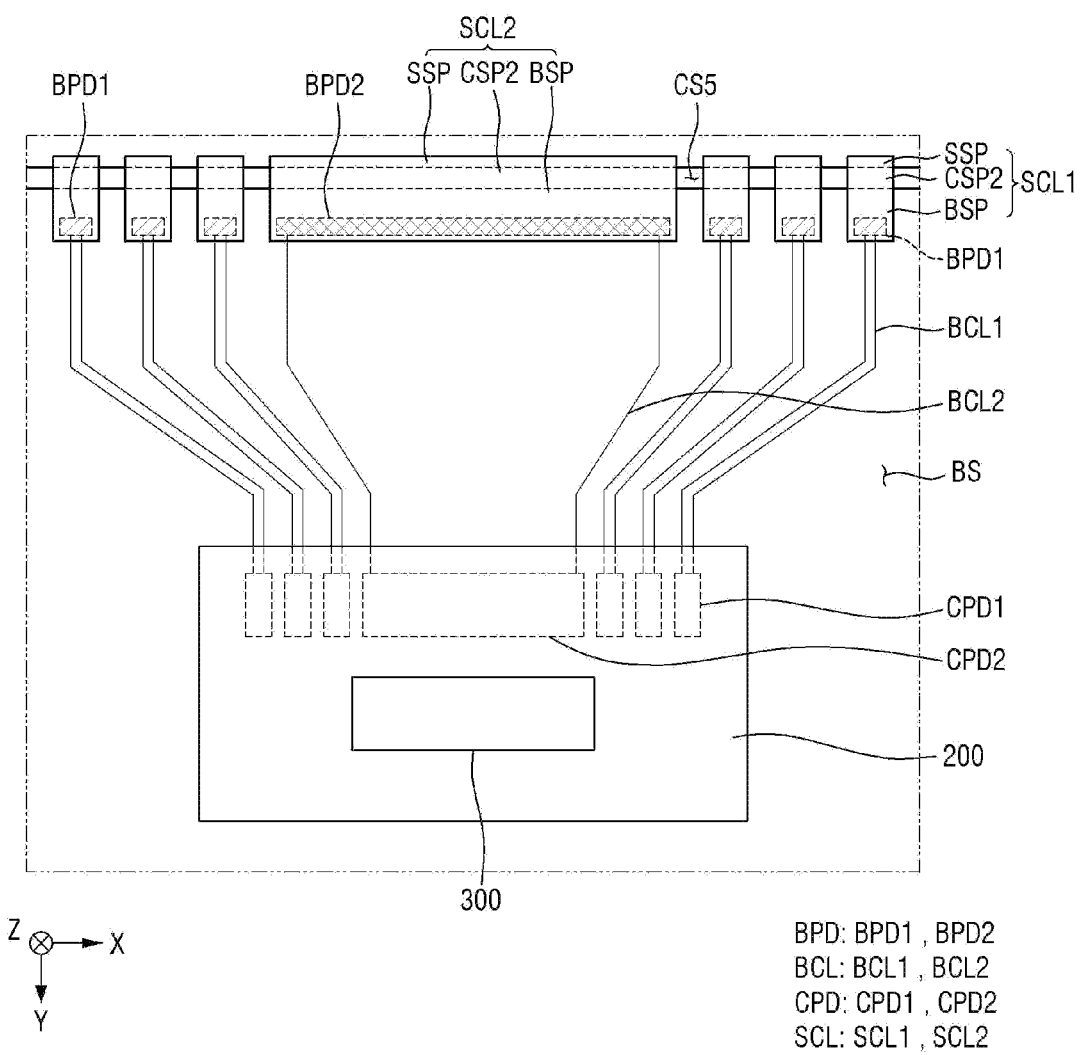
FIG. 12 is a rear view illustrating one side edge of the display device of FIG. 10.

FIG. 10 is a perspective view illustrating one side edge of a display device according to one or more embodiments, FIG. 11 is a plan view illustrating one side edge of the display device of FIG. 10, and FIG. 12 is a rear view illustrating one side edge of the display device of FIG. 10. The display device of FIGS. 10 to 12 has a different configuration of the side surface connection line SCL from the display device of FIGS. 5 to 7, and the same configuration as the aforementioned configuration will be briefly described or omitted.

Referring to FIGS. 10 to 12, the side surface connection line SCL may electrically connect the front pad part FPD with the rear pad part BPD. The side surface connection line SCL may include first and second side surface connection lines SCL1 and SCL2.

The first side surface connection line SCL1 may electrically connect the first front pad part FPD1 with the first rear pad part BPD1. The first front pad part FPD1 may be disposed at an edge of the first side of the first surface FS of the substrate SUB. The first front pad part FPD1 may be connected to a data line of the display panel 100 to supply a data voltage. The first rear pad part BPD1 may be electrically connected to the first contact pad part CPD1 through the first rear surface connection line BCL1. The first rear pad part BPD1 may supply the data voltage received from the display driver 300 to the first front pad part FPD1.

The second side surface connection line SCL2 may electrically connect the second front pad part FPD2 with the second rear pad part BPD2. The second front pad part FPD2 may be disposed at an edge of the first side of the first surface FS of the substrate SUB. The second front pad part FPD2 may be connected to a power line of the display panel 200 to supply a power voltage. The second rear pad part BPD2 may be electrically connected to the second contact pad part CPD2 through the second rear surface connection line BCL2. The second rear pad part BPD2 may supply the power voltage received from the display driver 300 to the second front pad part FPD2.

Each of the first and second side surface connection lines SCL1 and SCL2 may include the front portion FSP, the first chamfer portion CSP1, the side portion SSP, the second chamfer portion CSP2, and the rear portion BSP.

The front portion FSP may be disposed on the first surface FS of the substrate SUB. The front portion FSP may be disposed on the front pad part FPD to completely cover the front pad part FPD. The front portion FSP may be connected to the front pad part FPD.

The first chamfer portion CSP1 may be disposed on the first chamfered surface CS1 of the substrate SUB. The first chamfer portion CSP1 may be disposed between the front portion FSP and the side portion SSP.

The side portion SSP may be disposed on the first side surface SS1 of the substrate SUB. The side portion SSP may be disposed between the first chamfer portion CSP1 and the second chamfer portion CSP2.

The second chamfer portion CSP2 may be disposed on the fifth chamfered surface CS5 of the substrate SUB. The second chamfer portion CSP2 may be disposed between the side portion SSP and the rear portion BSP.

The rear portion BSP may be disposed on the second surface BS of the substrate SUB. The rear portion BSP may be disposed on the rear pad part BPD to completely cover the rear pad part BPD. The rear portion BSP may be connected to the rear pad part BPD.

An area of the second front pad part FPD2 may be larger than an area of the first front pad part FPD1. The area of the second front pad part FPD2 may be several to several hundred times the area of the first front pad part FPD1. An area of the second rear pad part BPD2 may be larger than an area of the first rear pad part BPD1. The area of the second rear pad part BPD2 may be several to several hundred times the area of the first rear pad part BPD1. One first front pad part FPD1 or one first rear pad part BPD1 may be connected to one first side surface connection line SCL1. One second front pad part FPD2 or one second rear pad part BPD2 may be connected to one second side surface connection line SCL2. Accordingly, the width of the first side surface connection line SCL1 may correspond to the size of the first front pad part FPD1 or the first rear pad part BPD1, and the width of the second side surface connection line SCL2 may correspond to the size of the second front pad part FPD2 or the second rear pad part BPD2.

A width of the second side surface connection line SCL2 may be greater than a width of the first side surface connection line SCL1. The first side surface connection line SCL1 may be an individual line, and the second side surface connection line SCL2 may be a cylindrical line, but the present disclosure is not limited thereto. For example, the width of the second side surface connection line SCL2 may be several to several hundred times the width of the first side surface connection line SCL1. Because the second side surface connection line SCL2 has a relatively large width, line resistance may be relatively reduced. Accordingly, the display device 10 may improve power transmission efficiency to improve quality.

Figure 13:
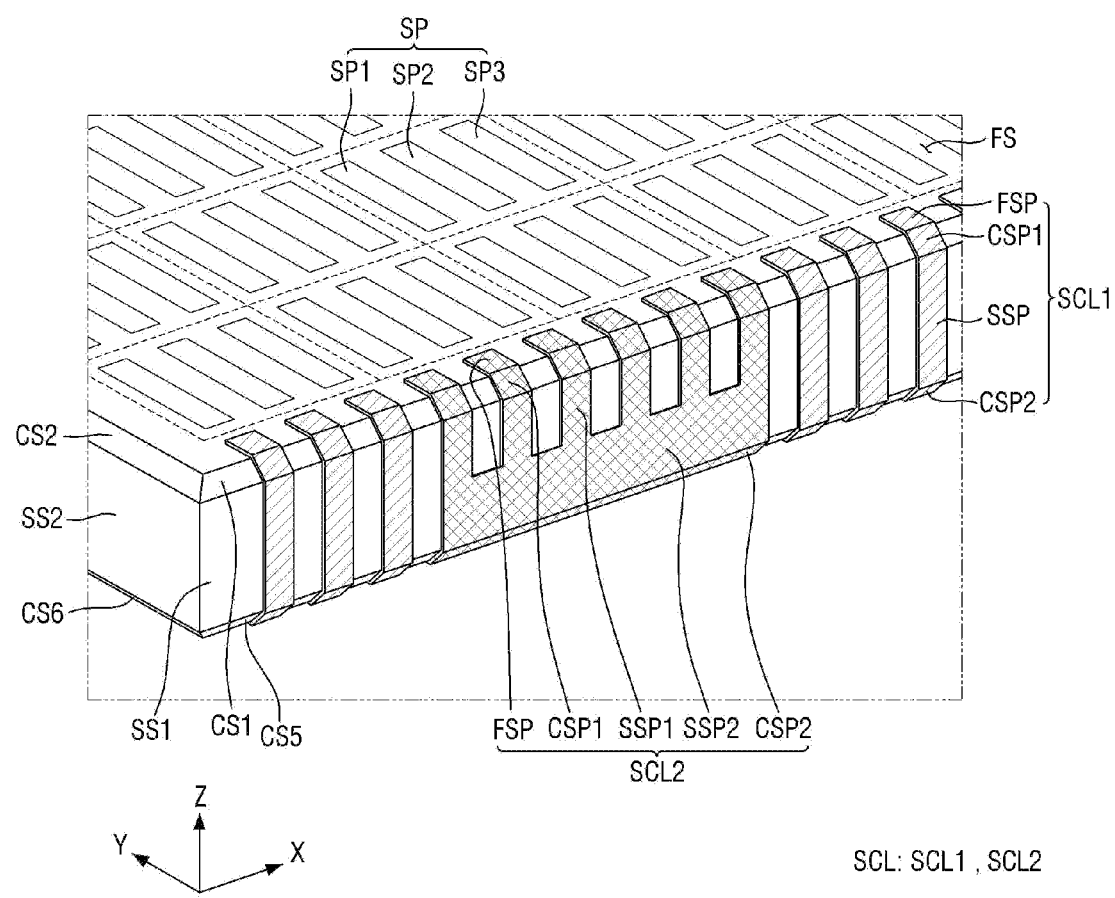
FIG. 13 is a perspective view illustrating one side edge of a display device according to one or more embodiments.
Figure 14:
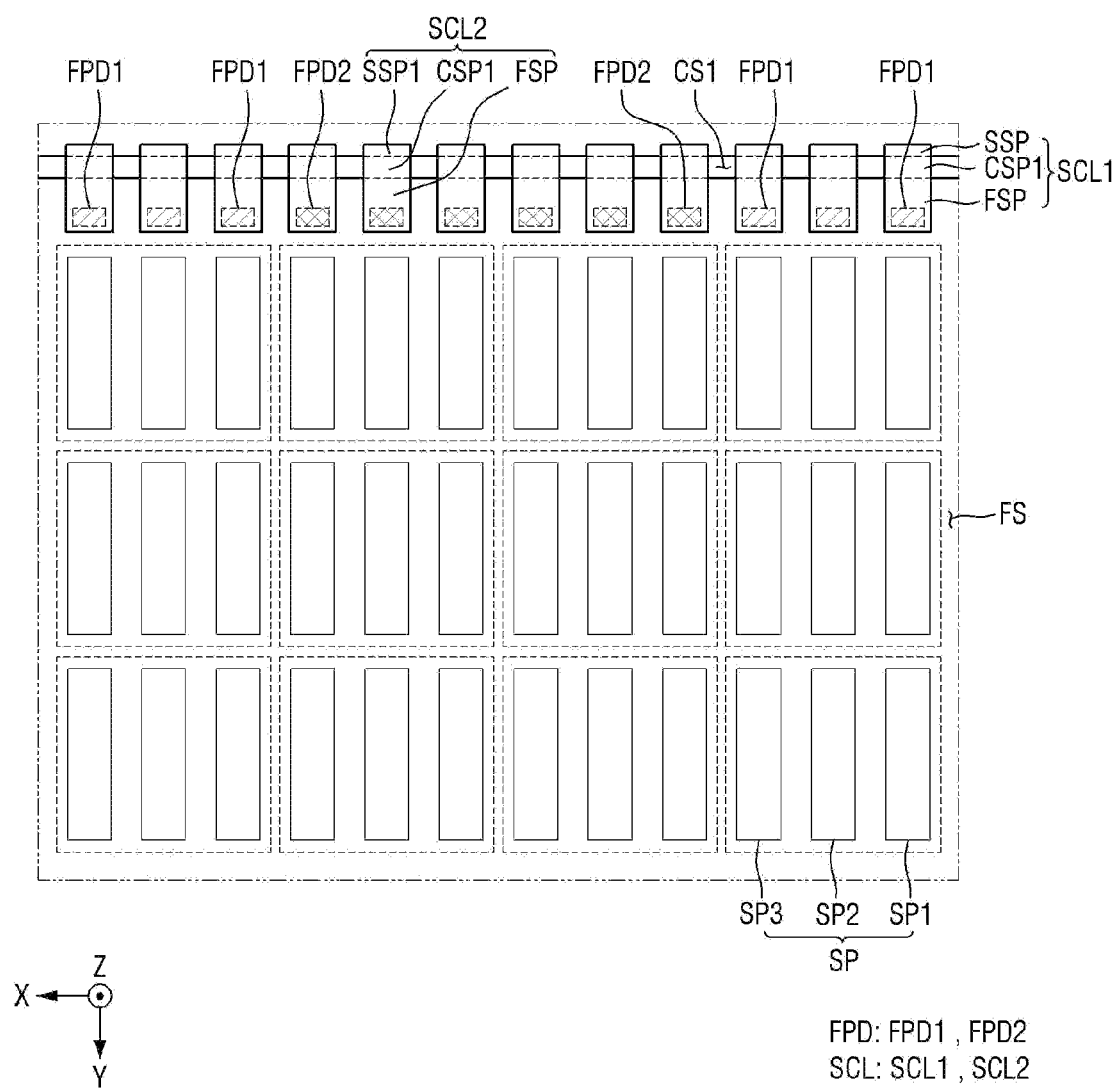
FIG. 14 is a plan view illustrating an example of one side edge of the display device of FIG. 13.
Figure 15:
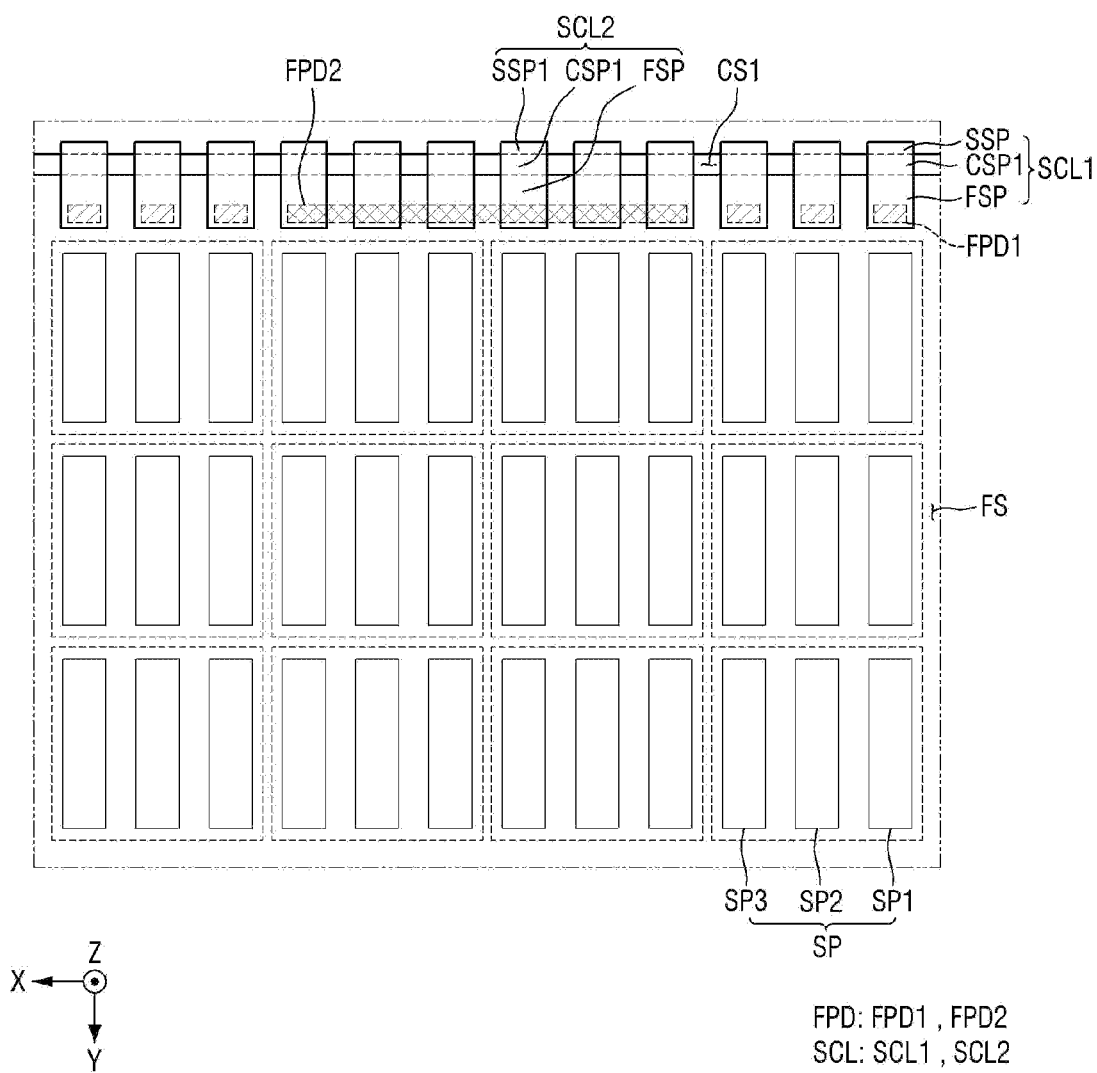
FIG. 15 is a plan view illustrating another example of one side edge of the display device of FIG. 13.
Figure 16:
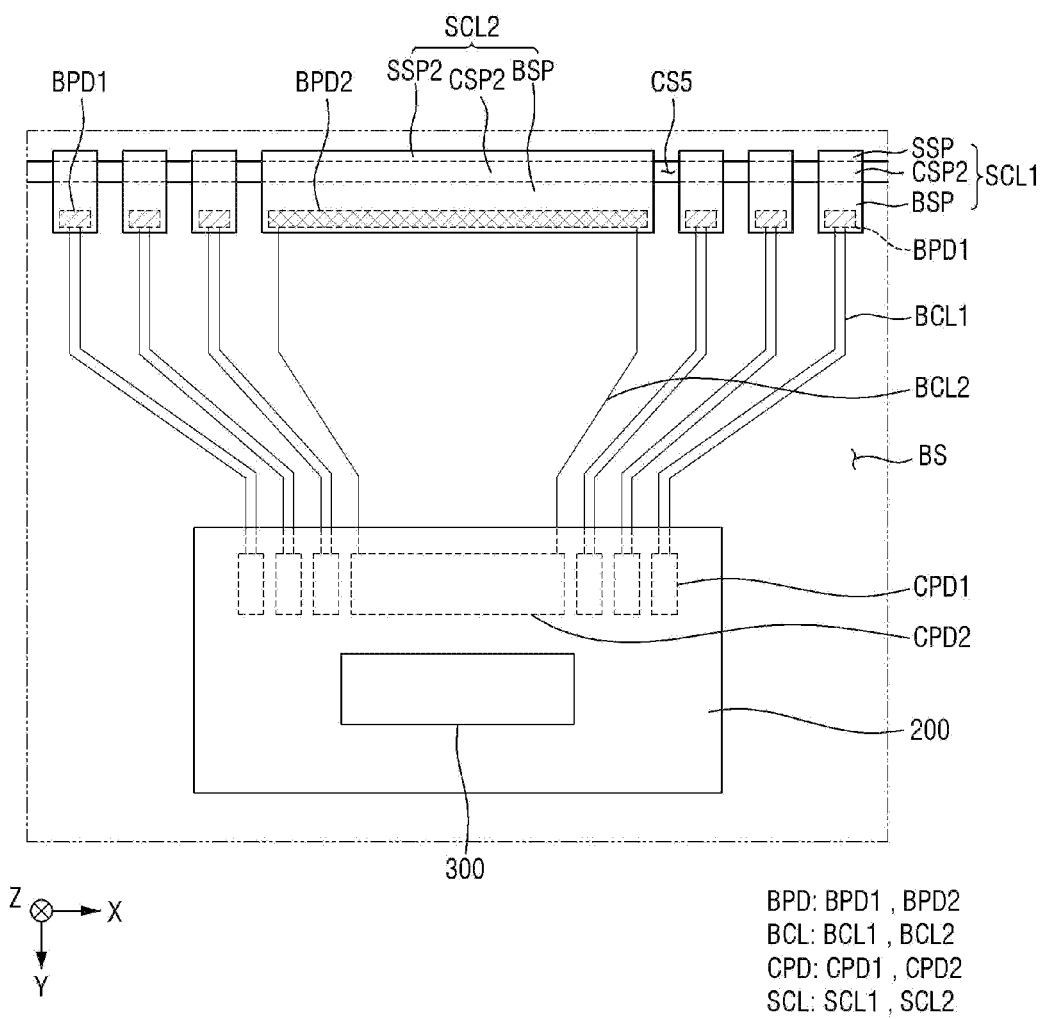
FIG. 16 is a rear view illustrating one side edge of the display device of FIG. 13.

FIG. 13 is a perspective view illustrating one side edge of a display device according to one or more embodiments. FIG. 14 is a plan view illustrating an example of one side edge of the display device of FIG. 13, and FIG. 15 is a plan view illustrating another example of one side edge of the display device of FIG. 13. FIG. 16 is a rear view illustrating one side edge of the display device of FIG. 13. The display device of FIGS. 13 to 16 has a different configuration of the side surface connection line SCL from the display device of FIGS. 5 to 7, and the same configuration as the aforementioned configuration will be briefly described or omitted.

Referring to FIGS. 13 to 16, the side surface connection line SCL may electrically connect the front pad part FPD with the rear pad part BPD. The side surface connection line SCL may include the first and second side surface connection lines SCL1 and SCL2.

The first side surface connection line SCL1 may electrically connect the first front pad part FPD1 with the first rear pad part BPD1. The first front pad part FPD1 may be disposed at an edge of the first side of the first surface FS of the substrate SUB. The first front pad part FPD1 may be connected to a data line of the display panel 100 to supply a data voltage. The first rear pad part BPD1 may be electrically connected to the first contact pad part CPD1 through the first rear surface connection line BCL1. The first rear pad part BPD1 may supply the data voltage received from the display driver 300 to the first front pad part FPD1.

The second side surface connection line SCL2 may electrically connect the second front pad part FPD2 with the second rear pad part BPD2. The second front pad part FPD2 may be disposed at an edge of the first side of the first surface FS of the substrate SUB. The second front pad part FPD2 may be connected to a power line of the display panel 200 to supply a power voltage. The second rear pad part BPD2 may be electrically connected to the second contact pad part CPD2 through the second rear surface connection line BCL2. The second rear pad part BPD2 may supply the power voltage received from the display driver 300 to the second front pad part FPD2.

The first side surface connection line SCL1 may include the front portion FSP, the first chamfer portion CSP1, the side portion SSP, the second chamfer portion CSP2, and the rear portion BSP. The second side surface connection line SCL2 may include a plurality of front portions FSP, a plurality of first chamfer portions CSP1, a plurality of first side portions SSP1, a second side portion SSP2, the second chamfer portion CSP2, and the rear portion BSP.

A plurality of front portions FSP of the second side surface connection line SCL2 may be disposed on the first surface FS of the substrate SUB. The front portion FSP may be disposed on the second front pad part FPD2 to completely cover the second front pad part FPD2. The front portion FSP may be connected to the second front pad part FPD2.

The plurality of first chamfer portions CSP1 of the second side surface connection line SCL2 may be disposed on the first chamfered surface CS1 of the substrate SUB. The first chamfer portion CSP1 may be disposed between the front portion FSP and the first side portion SSP1.

The plurality of first side portions SSP1 of the second side surface connection line SCL2 may be disposed on the first side surface SS1 of the substrate SUB. The plurality of first side portions SSP1 may be branched from one second side portion SSP2 on the first side surface SS1 of the substrate SUB. For example, several to hundreds of the first side portions SSP1 may be branched from one second side portion SSP2. The first side portion SSP1 may be disposed between the first chamfer portion CSP1 and the second side portion SSP2. Each of the plurality of first side portions SSP1 may correspond to each of the plurality of first chamfer portions CSP1, and the plurality of first side portions SSP1 may correspond to one second side portion SSP2.

The second side portion SSP2 of the second side surface connection line SCL2 may be disposed on the first side surface SS1 of the substrate SUB. One second side portion SSP2 may be disposed between the plurality of first side portions SSP1 and one second chamfer portion CSP2. The width of the second side portion SSP2 may be greater than the width of the first side portion SSP1. The first side portion SSP1 may be an individual line, and the second side portion SSP2 may be a cylindrical line, but the present disclosure is not limited thereto. For example, the width of the second side portion SSP2 may be several to several hundred times the width of the first side portion SSP1. Because the second side portion SSP2 has a relatively large width, line resistance may be relatively reduced.

The second chamfer portion CSP2 may be disposed on the fifth chamfered surface CS5 of the substrate SUB. The second chamfer portion CSP2 may be disposed between the second side portion SSP2 and the rear portion BSP.

The rear portion BSP may be disposed on the second surface BS of the substrate SUB. The rear portion BSP may be disposed on the rear pad part BPD to completely cover the rear pad part BPD. The rear portion BSP may be connected to the rear pad part BPD.

Accordingly, the display device 10 includes the second side surface connection line SCL2 having the plurality of front portions FSP disposed on the first surface FS of the substrate SUB and one rear portion BSP disposed on the second surface BS of the substrate SUB, so that the quality may be improved by relatively reducing the line resistance and improving power transmission efficiency. In addition, the second side surface connection line SCL2 may prevent excessive convexity or sagging of the metal paste during the printing process of the metal paste, and may prevent the second side surface connection line SCL2 from invading the contact pad part CPD.

In FIG. 14, the area of the first front pad part FPD1 and the area of the second front pad part FPD2 may be substantially the same. The first and second front pad parts FPD1 and FPD2 may be individual pads. One second front pad part FPD2 may be connected to one front portion FSP of the second side surface connection line SCL2.

In FIG. 15, an area of the second front pad part FPD2 may be larger than an area of the first front pad part FPD1. The first front pad part FPD1 may be an individual pad, and the second front pad part FPD2 may be a cylindrical pad, but the present disclosure is not limited thereto. The area of the second front pad part FPD2 may be several to several hundred times the area of the first front pad part FPD1. One second front pad part FPD2 may be connected to the plurality of front portions FSP of the second side surface connection line SCL2. Because the second front pad part FPD2 has a relatively large area, pad resistance may be relatively reduced. Accordingly, the display device 10 may improve the power transmission efficiency to improve the quality, and may prevent a dark line defect although some of the plurality of front portions FSP connected to the second front pad part FPD2 are disconnected.

Figure 17:
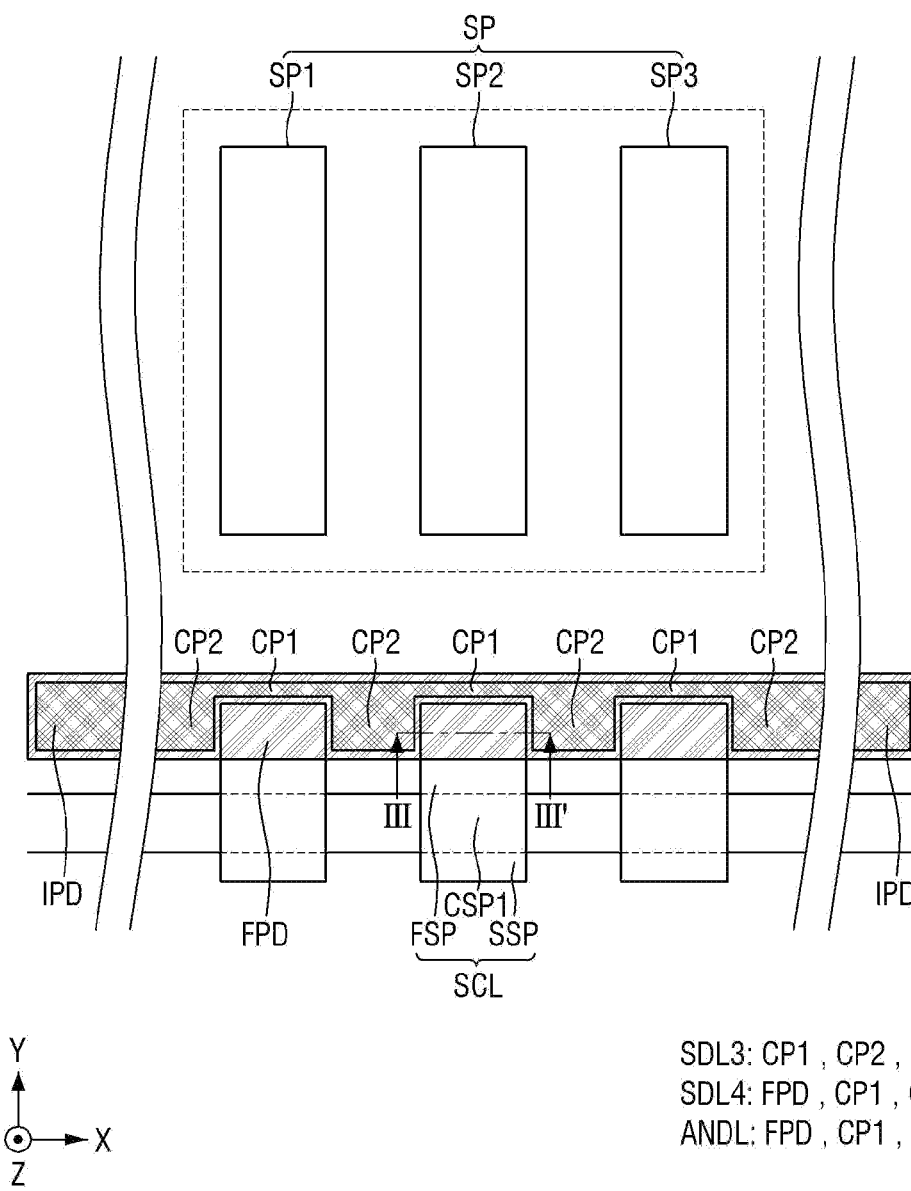
FIG. 17 is a plan view illustrating one side edge of the display device according to one or more embodiments.
Figure 18:
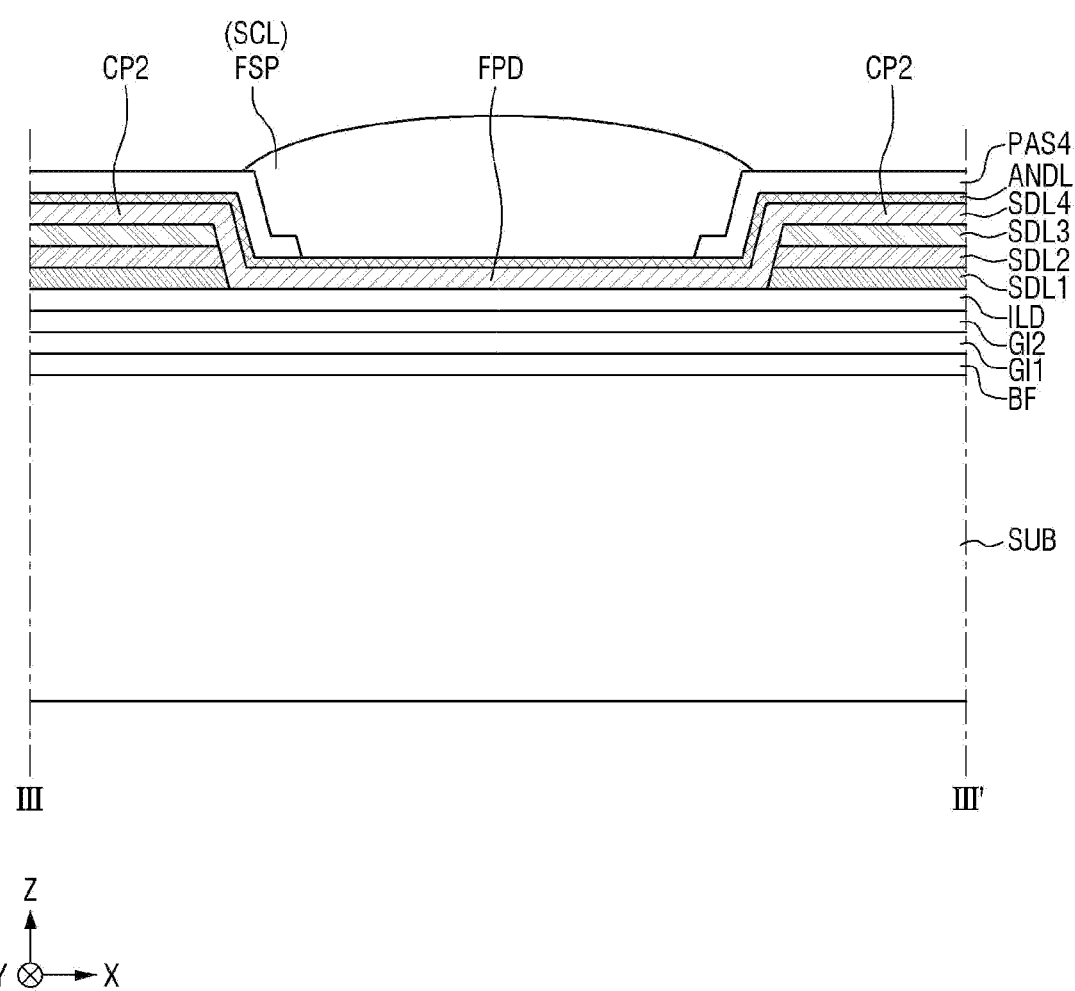
FIG. 18 is an example of a cross-sectional view taken along the line III-III' of FIG. 17.
Figure 19:
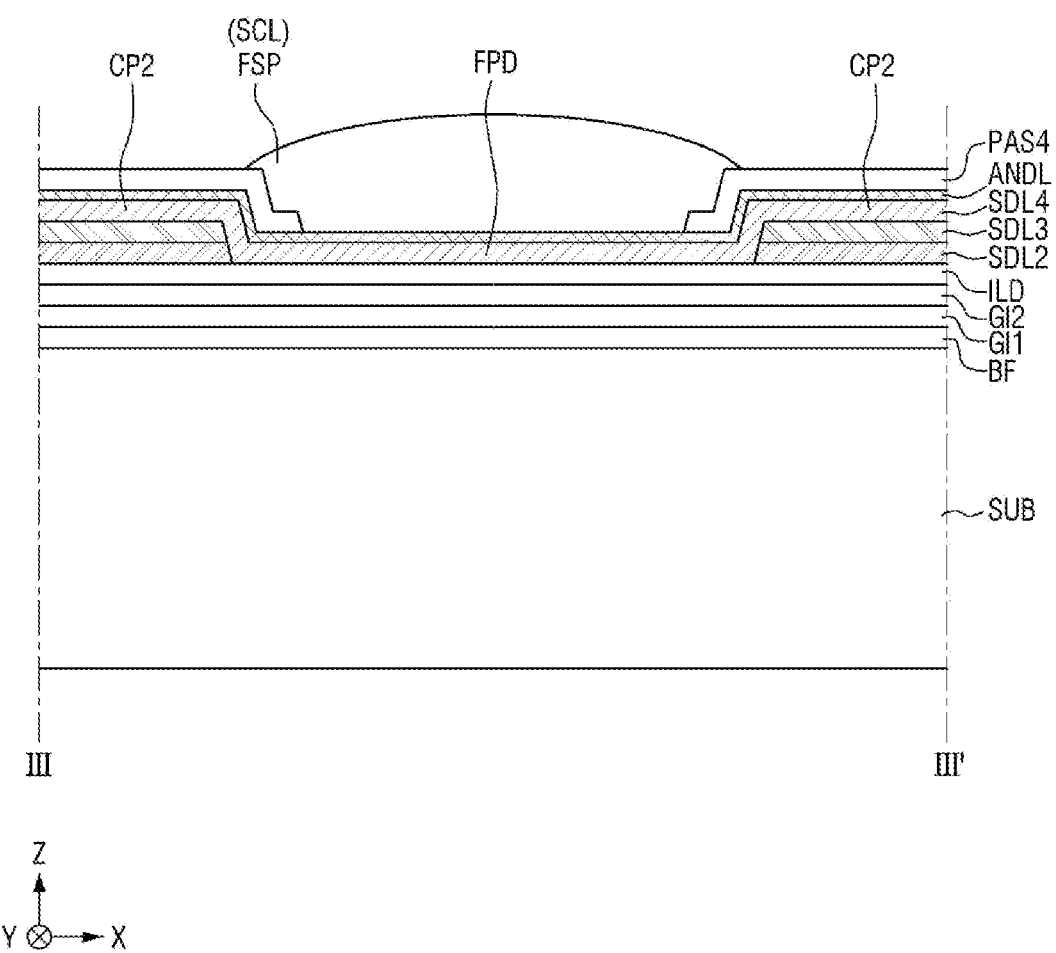
FIG. 19 is another example of a cross-sectional view taken along the line III-III' of FIG. 17.
Figure 20:
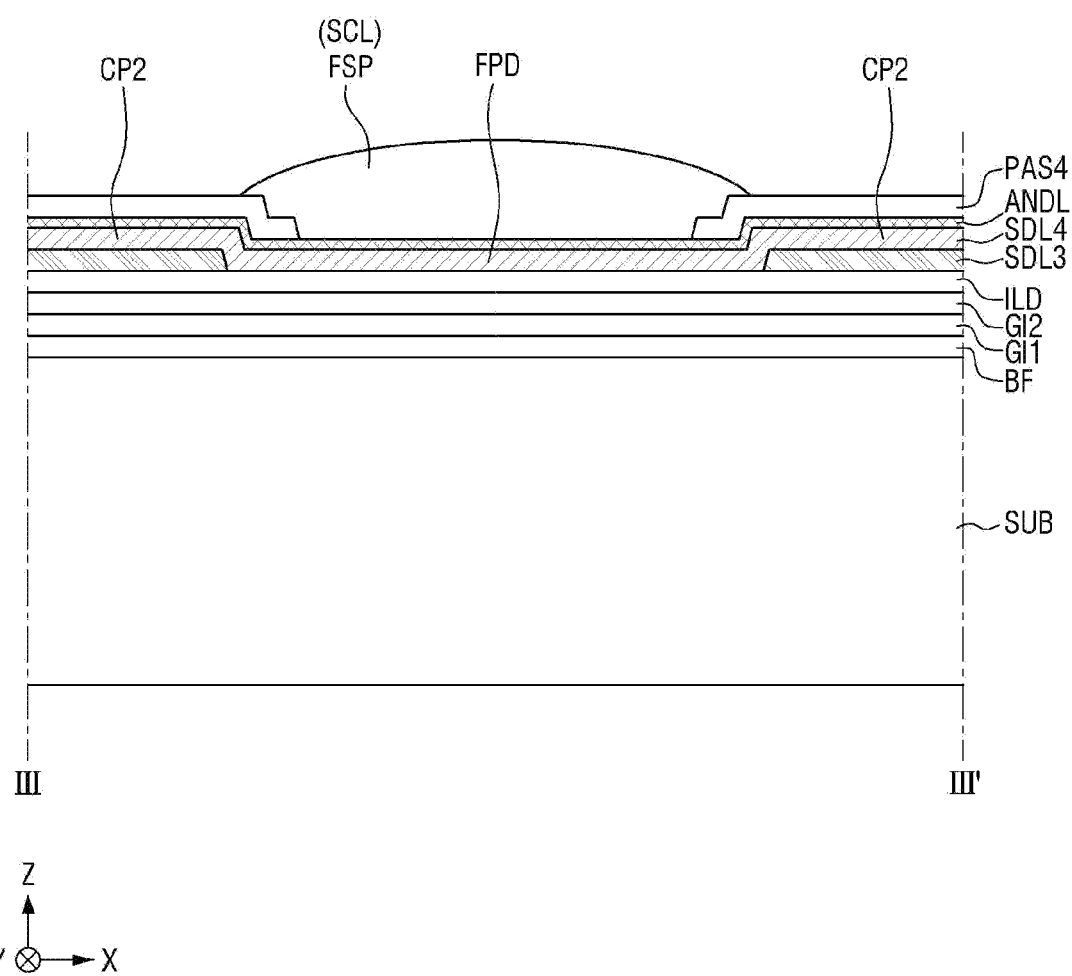
FIG. 20 is yet another example of a cross-sectional view taken along the line III-III' of FIG. 17.

FIG. 17 is a plan view illustrating one side edge of the display device according to one or more embodiments, and FIG. 18 is an example of a cross-sectional view taken along the line III-III' of FIG. 17. FIG. 19 is another example of a cross-sectional view taken along line the III-III' of FIG. 17, and FIG. 20 is yet another example of a cross-sectional view taken along the line III-III' of FIG. 17.

Referring to FIGS. 17 to 20, the display device 10 may include the front pad part FPD, a first connection pattern CP1, a second connection pattern CP2, and an inspection pad IPD.

The front pad part FPD may be formed by stacking the fourth source metal layer SDL4 and the anode layer ANDL. The fourth source metal layer SDL4 and the anode layer ANDL may be formed in the plurality of front pad parts FPD, and thus may be implemented as a cylindrical pad. The front pad part FPD may correspond to the portion in which the anode layer ANDL is exposed because the fourth passivation layer PAS4 is opened (e.g., the portion in which the fifth portion SPD5 of the first front pad part FPD1 is exposed because the fourth passivation layer PAS4 of FIG. 9 is opened). The front pad part FPD may be exposed by the fourth passivation layer PAS4 to be connected to the front portion FSP of the side surface connection line SCL. The side surface connection line SCL may electrically connect the front pad part FPD disposed on the first surface FS of the substrate SUB with the rear pad part BPD disposed on the second surface BS of the substrate SUB.

The first connection pattern CP1 and the second connection pattern CP2 may be formed of the same material in the same process. For example, the first and second connection patterns CP1 and CP2 may be formed by stacking the third and fourth source metal layers SDL3 and SDL4 and the anode layer ANDL. The third source metal layer SDL3 may overlap the fourth passivation layer PAS4 and may not overlap the front pad part FPD. The first connection pattern CP1 may be disposed on the upper side of the front pad part FPD to connect the adjacent second connection patterns CP2 in the first direction (X-axis direction). The second connection pattern CP2 may be disposed on the left side and right side of the front pad part FPD. The first and second connection patterns CP1 and CP2 may alternately extend in the first direction (X-axis direction) to electrically connect the inspection pads IPD disposed on both sides of the front pad part FPD.

In FIG. 18, the first and second connection patterns CP1 and CP2 may be formed by stacking the first to fourth source metal layers SDL1, SDL2, SDL3, and SDL4 and the anode layer ANDL. A height of the first and second connection patterns CP1 and CP2 may be higher than a height of the front pad part FPD in the Z-axis direction. The first and second connection patterns CP1 and CP2 may surround the left side, the upper side, and the right side of the front pad part FPD. The first and second connection patterns CP1 and CP2 may surround the left side, the upper side, and the right side of the front portion FSP of the side surface connection line SCL, so that it is possible to prevent the leakage of the front portion FSP of the side surface connection line SCL to the outside because the front portion FSP is concentrated on the front pad part FPD.

FIG. 19, the first and second connection patterns CP1 and CP2 may be formed by stacking the second to fourth source metal layers SDL2, SDL3, and SDL4 and the anode layer ANDL. The height of the first and second connection patterns CP1 and CP2 may be higher than the height of the front pad part FPD in the Z-axis direction. The first and second connection patterns CP1 and CP2 may surround the left side, the upper side, and the right side of the front pad part FPD. The first and second connection patterns CP1 and CP2 may surround the left side, the upper side, and the right side of the front portion FSP of the side surface connection line SCL, so that it is possible to prevent the leakage of the front portion FSP of the side surface connection line SCL to the outside because the front portion FSP is concentrated on the front pad part FPD.

In FIG. 20, the first and second connection patterns CP1 and CP2 may be formed by stacking the third and fourth source metal layers SDL3 and SDL4 and the anode layer ANDL. The height of the first and second connection patterns CP1 and CP2 may be higher than the height of the front pad part FPD in the Z-axis direction. The first and second connection patterns CP1 and CP2 may surround the left side, the upper side, and the right side of the front pad part FPD. The first and second connection patterns CP1 and CP2 may surround the left side, the upper side, and the right side of the front portion FSP of the side surface connection line SCL, so that it is possible to prevent the leakage of the front portion FSP of the side surface connection line SCL to the outside because the front portion FSP is concentrated on the front pad part FPD.

Accordingly, the display device 10 may form the front portion FSP of the side surface connection line SCL by including the third source metal layer SDL3 constituting the first and second connection patterns CP1 and CP2, and may reduce the pad resistance and improve the power transmission efficiency by including the fourth source metal layer SDL4 and the anode layer ANDL that implement a cylindrical pad.

Figure 21:
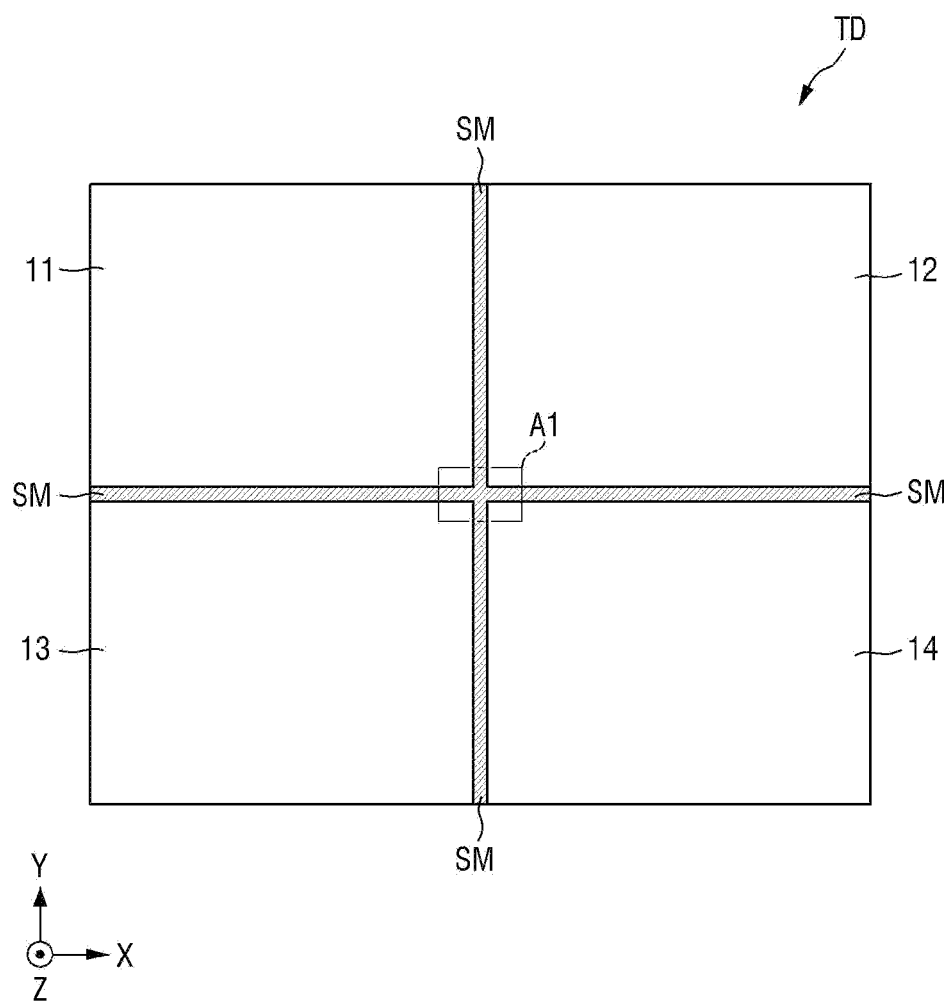
FIG. 21 is a plan view illustrating a tiled display device according to one or more embodiments.

FIG. 21 is a plan view illustrating a tiled display device according to one or more embodiments.

Referring to FIG. 21, a tiled display device TD may include first to fourth display devices 11, 12, 13, and 14 and a coupling area SM. The first to fourth display devices 11, 12, 13, and 14 may be arranged in a grid shape, but the present disclosure is not limited thereto. The first to fourth display devices 11, 12, 13, and 14 may be connected in the first direction (X-axis direction) or the second direction (Y-axis direction), and the tiled display device TD may have a specific shape. For example, each of the first to fourth display devices 11, 12, 13, and 14 may have the same size, but is not limited thereto. For another example, the first to fourth display devices 11, 12, 13, and 14 may have different sizes. The number and coupling relationship of the display devices 10 are not limited to the embodiment of FIG. 21. The number of the display devices 10 may be determined according to the size of each of the display devices 10 and the tiled display device TD.

The first to fourth display devices 11, 12, 13, and 14 may be arranged in a grid shape. The first to fourth display devices 11, 12, 13, and 14 may be arranged in a matrix form in M (M is a positive integer) rows and N (N is a positive integer) columns. For example, the first display device 11 and the second display device 12 may be adjacent to each other in the first direction (X-axis direction). The first display device 11 and the third display device 13 may be adjacent to each other in the second direction (Y-axis direction). The third display device 13 and the fourth display device 14 may be adjacent to each other in the first direction (X-axis direction). The second display device 12 and the fourth display device 14 may be adjacent to each other in the second direction (Y-axis direction).

Each of the first to fourth display devices 11, 12, 13, and 14 may have a rectangular shape including long sides and short sides. The first to fourth display devices 11, 12, 13, and 14 may be disposed such that the long sides or the short sides thereof are connected to each other. Some or all of the first to fourth display devices 11, 12, 13, and 14 may be disposed at an edge of the tiled display device TD, and may form one side of the tiled display device TD. At least one of the first to fourth display devices 11, 12, 13, and 14 may be disposed at at least one corner of the tiled display device TD, and may form two adjacent sides of the tiled display device TD. At least one of the first to fourth display devices 11, 12, 13, and 14 may be surrounded by other display devices.

Each of the first to fourth display devices 11, 12, 13, and 14 may be substantially the same as the display device 10 described with reference to FIG. 1. Accordingly, a description of each of the first to fourth display devices 11, 12, 13, and 14 will be omitted.

The coupling area SM may include a coupling member or an adhesive member. In this case, the first to fourth display devices 11, 12, 13, and 14 may be connected to each other by the coupling member or the adhesive member of the coupling area SM. The coupling area SM may be disposed between the first display device 11 and the second display device 12, between the first display device 11 and the third display device 13, between the second display device 12 and the fourth display device 14, and between the third display device 13 and the fourth display device 14.

Figure 22:
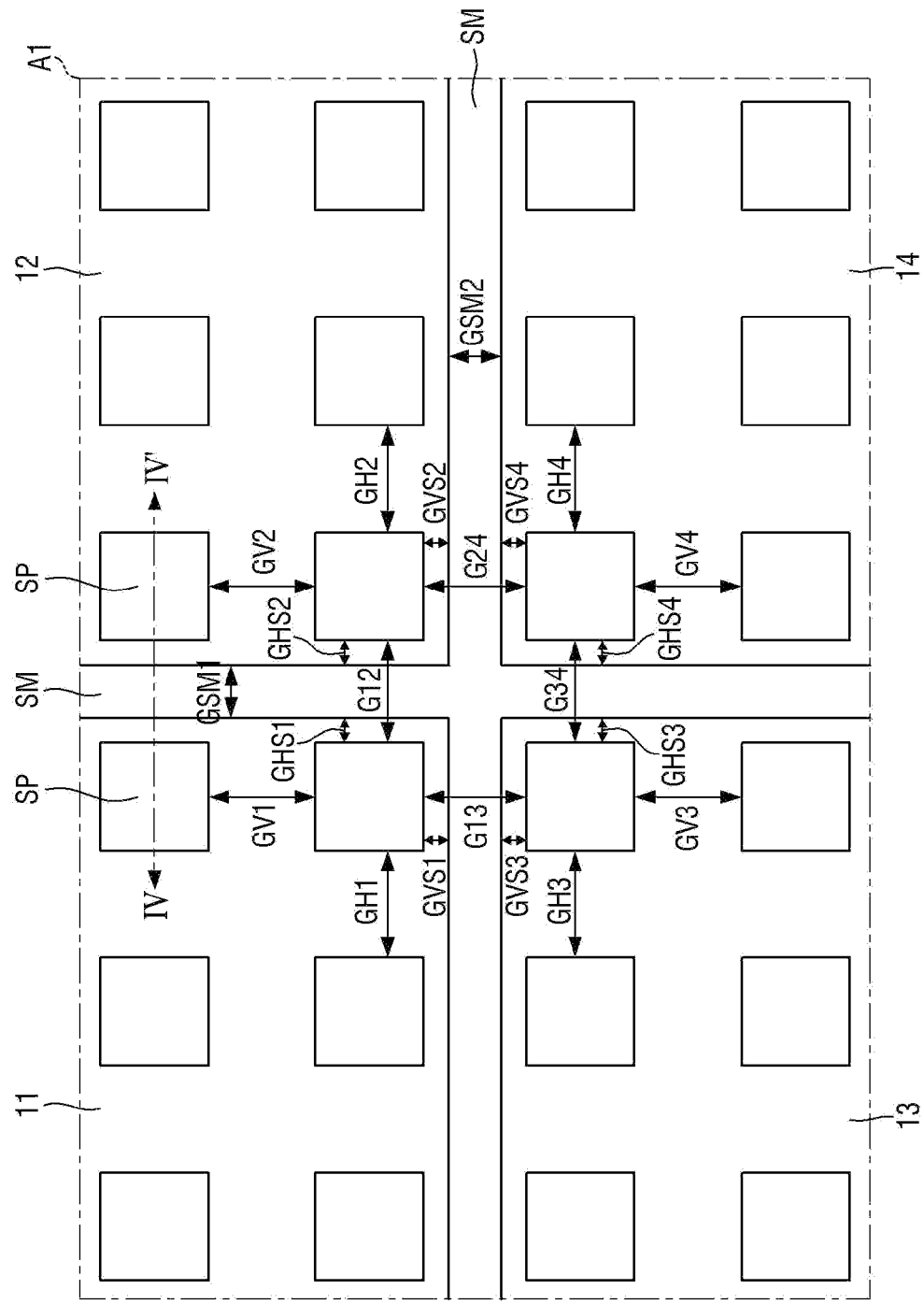
FIG. 22 is an enlarged view of an area A1 of FIG. 21.

FIG. 22 is an enlarged view of an area A1 of FIG. 21.

Referring to FIG. 22, the coupling area SM may have a planar shape of the Chinese character 'ten', a cross, or a plus sign in a central area of the tiled display device TD adjacent to the first to fourth display devices 11, 12, 13 and 14. The coupling area SM may be disposed between the first display device 11 and the second display device 12, between the first display device 11 and the third display device 13, between the second display device 12 and the fourth display device 14, and between the third display device 13 and the fourth display device 14.

The first to fourth display devices 11, 12, 13, and 14 may display an image by including the pixels SP arranged in a matrix form along the first direction (X-axis direction) and the second direction (Y-axis direction). The minimum distance between the pixels SP of the first display device 11 adjacent in the first direction (X-axis direction) may be defined as a first horizontal separation distance GH1, and the minimum distance between the pixels SP of the second display device 12 adjacent in the first direction (X-axis direction) may be defined as a second horizontal separation distance GH2. The first horizontal separation distance GH1 and the second horizontal separation distance GH2 may be substantially the same.

The coupling area SM may be disposed between the pixel SP of the first display device 11 and the pixel SP of the second display device 12 adjacent in the first direction (X-axis direction). A minimum distance G12 between the pixel SP of the first display device 11 and the pixel SP of the second display device 12 may be the sum of a minimum distance GHS1 between the pixel SP of the first display device 11 and the coupling area SM in the first direction (X-axis direction), a minimum distance GHS2 between the pixel SP of the second display device 12 and the coupling area SM in the first direction (X-axis direction), and a width GSM1 of the coupling area SM in the first direction (X-axis direction).

The minimum distance G12 between the pixel SP of the first display device 11 and the pixel SP of the second display device 12, the first horizontal separation distance GH1, and the second horizontal separation distance GH2 may be substantially the same. To this end, the minimum distance GHS1 between the pixel SP of the first display device 11 and the coupling area SM in the first direction (X-axis direction) may be smaller than the first horizontal separation distance GH1, and the minimum distance GHS2 between the pixel SP of the second display device 12 and the coupling area SM in the first direction (X-axis direction) may be smaller than the second horizontal separation distance GH2. In addition, the width GSM1 of the coupling area SM in the first direction (X-axis direction) may be smaller than the first horizontal separation distance GH1 or the second horizontal separation distance GH2.

The minimum distance between the pixels SP of the third display device 13 adjacent in the first direction (X-axis direction) may be defined as a third horizontal separation distance GH3, and the minimum distance between the pixels SP of the fourth display device 14 adjacent in the first direction (X-axis direction) may be defined as a fourth horizontal separation distance GH4. The third horizontal separation distance GH3 and the fourth horizontal separation distance GH4 may be substantially the same.

The coupling area SM may be disposed between the pixel SP of the third display device 13 and the pixel SP of the fourth display device 14 adjacent in the first direction (X-axis direction). A minimum distance G34 between the pixel SP of the third display device 13 and the pixel SP of the fourth display device 14 may be the sum of a minimum distance GHS3 between the pixel SP of the third display device 13 and the coupling area SM in the first direction (X-axis direction), a minimum distance GHS4 between the pixel SP of the fourth display device 14 and the coupling area SM in the first direction (X-axis direction), and the width GSM1 of the coupling area SM in the first direction (X-axis direction).

The minimum distance G34 between the pixel SP of the third display device 13 and the pixel SP of the fourth display device 14, the third horizontal separation distance GH3, and the fourth horizontal separation distance GH4 may be substantially the same. To this end, the minimum distance GHS3 between the pixel SP of the third display device 13 and the coupling area SM in the first direction (X-axis direction) may be smaller than the third horizontal separation distance GH3, and the minimum distance GHS4 between the pixel SP of the fourth display device 14 and the coupling area SM in the first direction (X-axis direction) may be smaller than the fourth horizontal separation distance GH4. In addition, the width GSM1 of the coupling area SM in the first direction (X-axis direction) may be smaller than the third horizontal separation distance GH3 or the fourth horizontal separation distance GH4.

The minimum distance between the pixels SP of the first display device 11 adjacent in the second direction (Y-axis direction) may be defined as a first vertical separation distance GV1, and the minimum distance between the pixels SP of the third display device 13 adjacent in the second direction (Y-axis direction) may be defined as a third vertical separation distance GV3. The first vertical separation distance GV1 and the third vertical separation distance GV3 may be substantially the same.

The coupling area SM may be disposed between the pixel SP of the first display device 11 and the pixel SP of the third display device 13 adjacent in the second direction (Y-axis direction). A minimum distance G13 between the pixel SP of the first display device 11 and the pixel SP of the third display device 13 may be the sum of a minimum distance GVS1 between the pixel SP of the first display device 11 and the coupling area SM in the second direction (Y-axis direction), a minimum distance GVS3 between the pixel SP of the third display device 13 and the coupling area SM in the second direction (Y-axis direction), and a width GSM2 of the coupling area SM in the second direction (Y-axis direction).

The minimum distance G13 between the pixel SP of the first display device 11 and the pixel SP of the third display device 13, the first vertical separation distance GV1, and the third vertical separation distance GV3 may be substantially the same. To this end, the minimum distance GVS1 between the pixel SP of the first display device 11 and the coupling area SM in the second direction (Y-axis direction) may be smaller than the first vertical separation distance GV1, and the minimum distance GVS3 between the pixel SP of the third display device 13 and the coupling area SM in the second direction (Y-axis direction) may be smaller than the third vertical separation distance GV3. In addition, the width GSM2 of the coupling area SM in the second direction (Y-axis direction) may be smaller than the first vertical separation distance GV1 or the third vertical separation distance GV3.

The minimum distance between the pixels SP of the second display device 12 adjacent in the second direction (Y-axis direction) may be defined as a second vertical separation distance GV2, and the minimum distance between the pixels SP of the fourth display device 14 adjacent in the second direction (Y-axis direction) may be defined as a fourth vertical separation distance GV4. The second vertical separation distance GV2 and the fourth vertical separation distance GV4 may be substantially the same.

The coupling area SM may be disposed between the pixel SP of the second display device 12 and the pixel SP of the fourth display device 14 adjacent in the second direction (Y-axis direction). A minimum distance G24 between the pixel SP of the second display device 12 and the pixel SP of the fourth display device 14 may be the sum of a minimum distance GVS2 between the pixel SP of the second display device 12 and the coupling area SM in the second direction (Y-axis direction), a minimum distance GVS4 between the pixel SP of the fourth display device 14 and the coupling area SM in the second direction (Y-axis direction), and the width GSM2 of the coupling area SM in the second direction (Y-axis direction).

The minimum distance G24 between the pixel SP of the second display device 12 and the pixel SP of the fourth display device 14, the second vertical separation distance GV2, and the fourth vertical separation distance GV4 may be substantially the same. To this end, the minimum distance GVS2 between the pixel SP of the second display device 12 and the coupling area SM in the second direction (Y-axis direction) may be smaller than the second vertical separation distance GV2, and the minimum distance GVS4 between the pixel SP of the fourth display device 14 and the coupling area SM in the second direction (Y-axis direction) may be smaller than the fourth vertical separation distance GV4. In addition, the width GSM2 of the coupling area SM in the second direction (Y-axis direction) may be smaller than the second vertical separation distance GV2 or the fourth vertical separation distance GV4.

Accordingly, the minimum distance between the pixels SP of the display devices 10 adjacent to each other is substantially the same as the minimum distance between the pixels SP of each of the display devices 10, so that the coupling area SM may be prevented from being visible.

In order for the coupling area not to be visible, the minimum distance between the pixels of the display devices adjacent to each other may be substantially the same as the minimum distance between the pixels of each of the display devices.

Figure 23:
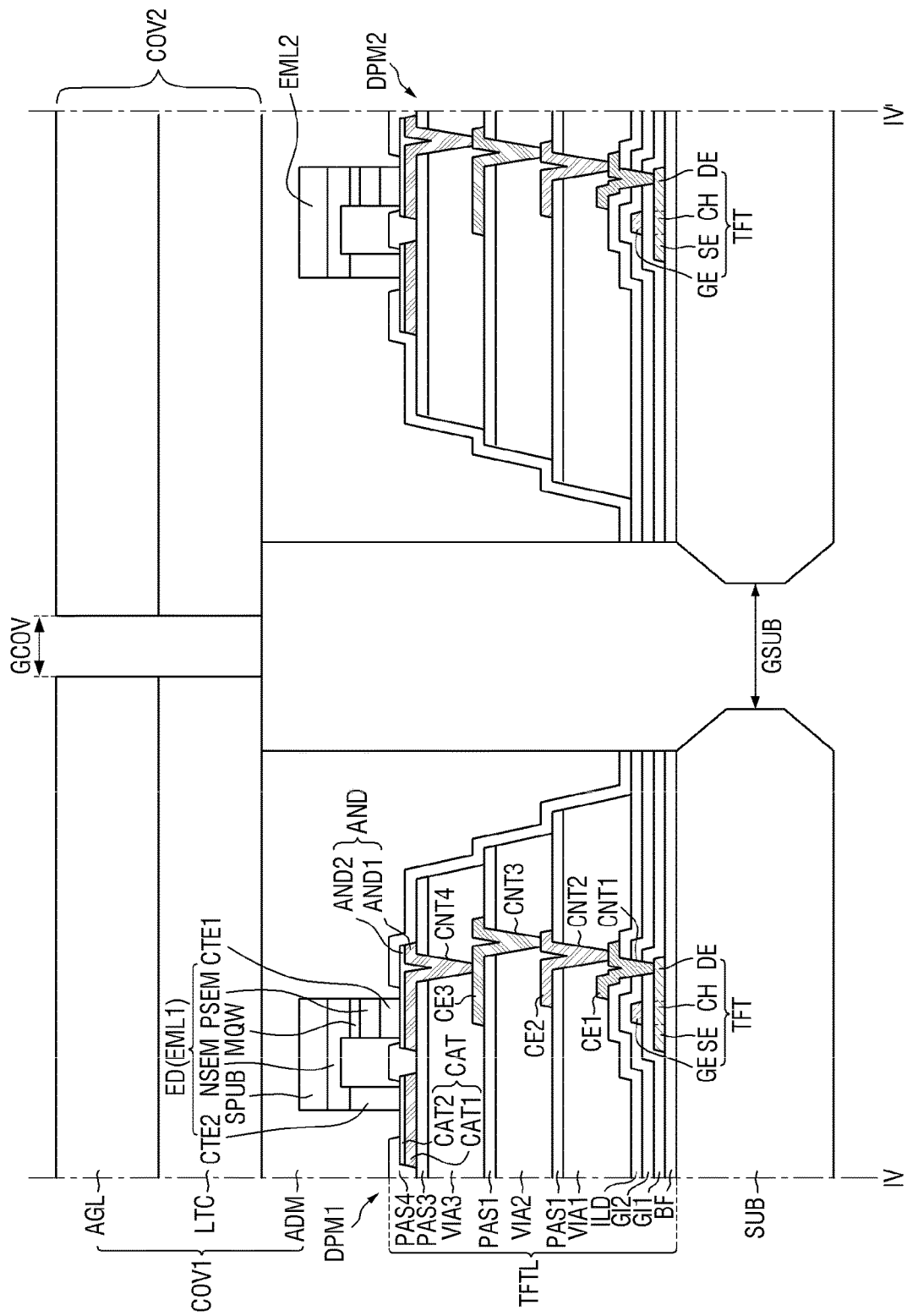
FIG. 23 is a cross-sectional view taken along the line IV-IV' of FIG. 22.

FIG. 23 is a cross-sectional view taken along the line IV-IV' of FIG. 22.

Referring to FIG. 23, the first display device 11 includes a first display module DPM1 and a first front cover COV1. The second display device 12 includes a second display module DPM2 and a second front cover COV2.

Each of the first display module DPM1 and the second display module DPM2 may include the substrate SUB, a thin film transistor layer TFTL, and the light emitting elements ED. Because the thin film transistor layer TFTL and the light emitting element ED have been described in detail with reference to FIGS. 8 and 9, the same configuration as the aforementioned configuration will be briefly described or omitted.

The first front cover COV1 may be disposed on the substrate SUB. That is, the first front cover COV1 may protrude more than the substrate SUB in the first direction (X-axis direction) and the second direction (Y-axis direction). Accordingly, a distance GSUB between the substrate SUB of the first display device 11 and the substrate SUB of the second display device 12 may be greater than a distance GCOV between the first front cover COV1 and the second front cover COV2.

Each of the first front cover COV1 and the second front cover COV2 may include an adhesive member ADM, a light transmittance control layer LTC disposed on the adhesive member ADM, and an anti-glare layer AGL disposed on the light transmittance control layer LTC.

The adhesive member ADM of the first front cover COV1 may attach a light emitting element layer EML1 of the first display module DPM1 to the first front cover COV1. The adhesive member ADM of the second front cover COV2 may attach the light emitting element layer EML2 of the second display module DPM2 to the second front cover COV2. The adhesive member ADM may be a transparent adhesive member capable of transmitting light. For example, the adhesive member ADM may be an optically clear adhesive film or an optically clear resin.

The anti-glare layer AGL may reflect external light as it is and diffusely reflect external light to prevent deterioration of image visibility. The anti-glare layer AGL may improve a contrast ratio of images displayed by the first display device 10 and the second display device 20.

The light transmittance control layer LTC may reduce transmittance of external light or light reflected from the first display module DPM1 and the second display module DPM2. The light transmittance control layer LTC may prevent the distance GSUB between the substrate SUB of the first display module DPM1 and the substrate SUB of the second display module DPM2 from being visible from the outside.

The anti-glare layer AGL may be implemented as a polarizing plate, and the light transmittance control layer LTC may be implemented as a phase delay layer, but the present disclosure is not limited thereto.

Figure 24:
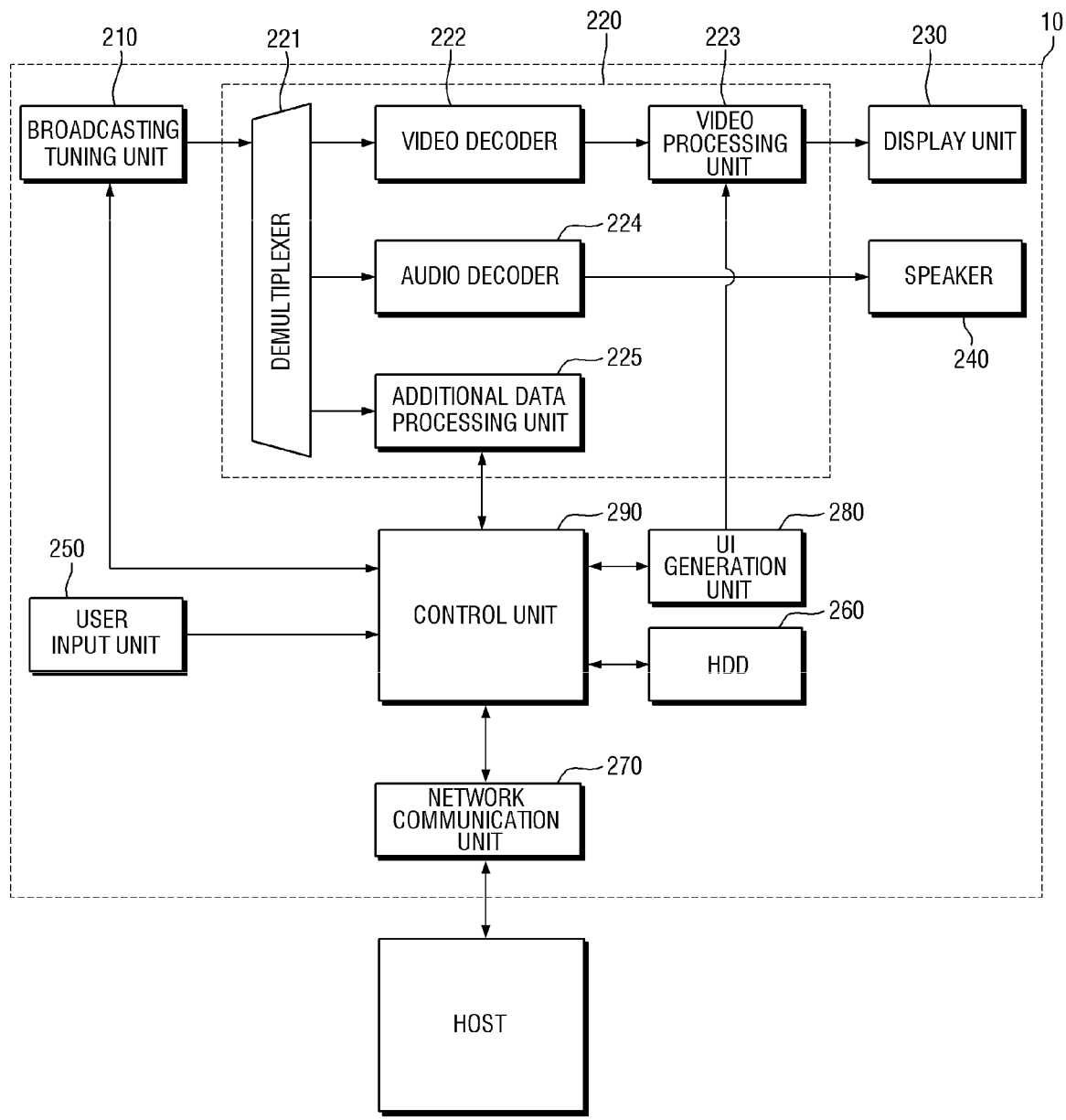
FIG. 24 is a block diagram illustrating a display system of a display device according to one or more embodiments.

FIG. 24 is a block diagram illustrating a display system of a display device according to one or more embodiments.

Referring to FIG. 24, the tiled display device TD may include a host system HOST and a plurality of display devices 10.

The host system HOST may be implemented as any one of a television system, a home theater system, a set-top box, a navigation system, a DVD player, a Blu-ray player, a personal computer (PC), a mobile phone system, and a tablet.

The host system HOST may receive a user's command in various formats. For example, the host system HOST may receive a command by a user's touch input. For another example, the host system HOST may receive a user's command by a keyboard input or a button input of a remote controller.

The host system HOST may receive original video data corresponding to the original image from the outside. The host system HOST may divide the original video data by the number of display devices. For example, in one or more embodiments, as shown in FIG. 21, the host system HOST may divide the original video data into first video data corresponding to the first display device 11, second video data corresponding to the second display device 12, third video data corresponding to the third display device 13, and fourth video data corresponding to the fourth display device 14. The host system HOST may transmit the first video data to the first display device 11, transmit the second video data to the second display device 12, transmit the third video data to the third display device 13, and transmit the fourth video data to the fourth display device 14.

In one or more embodiments, the first display device 11 may display a first image based on the first video data, the second display device 12 may display a second image based on the second video data, the third display device 13 may display a third image based on the third video data, and the fourth display device 14 may display a fourth image based on the fourth video data. Accordingly, the user may view the original image in which the first to fourth images displayed on the first to fourth display devices 11, 12, 13 and 14 are combined.

The display device 10 may include a broadcast tuning unit 210, a signal processing unit 220, a display unit 230, a speaker 240, a user input unit 250, a hard disk drive (HDD) 260 (e.g., a storage device (e.g., a solid state drive (SSD)), a network communication unit 270, a UI generating unit 280, and a control unit 290.

The broadcast tuning unit 210 may receive a broadcast signal of a corresponding channel through an antenna by tuning a channel frequency based on the control signal of the control unit 290. The broadcast tuning unit 210 may include a channel detection module and an RF module. The channel detection module may tune the channel frequency, and the RF module may demodulate the received broadcast signal.

The signal processing unit 220 may process the broadcast signal demodulated by the broadcast tuning unit 210 and output the processed result to the display unit 230 and the speaker 240. The signal processing unit 220 may include a demultiplexer 221, a video decoder 222, a video processing unit 223, an audio decoder 224, and an additional data processing unit 225.

The demultiplexer 221 may separate the demodulated broadcast signal into a video signal, an audio signal, and additional data. Each of the separated video signal, audio signal, and additional data may be restored by the video decoder 222, the audio decoder 224, or the additional data processing unit 225. The video decoder 222, the audio decoder 224, and the additional data processing unit 225 may restore the broadcast signal by using a decoding format corresponding to an encoding format during broadcast signal transmission.

The video processing unit 223 may convert the decoded video signal to fit the vertical frequency, resolution, aspect ratio, and the like that meet the output standard of the display unit 230, and the speaker 240 may receive the decoded audio signal to output sound.

The display unit 230 may include a display panel on which an image is displayed and the display driver 300 (e.g., see FIG. 7) that drives the display panel.

The user input unit 250 may receive a signal from the host system HOST. The user input unit 250 may receive data related to channel selection and user interface (UI) menu selection and manipulation from the host system HOST, as well as data related to communication between other display devices 10.

The HDD 260 may store various software programs including an OS program, recorded broadcast programs, moving images, photos, and other data. For example, the HDD 260 may include a storage medium such as a hard disk or a non-volatile memory.

The network communication unit 270 may perform short-distance communication between the host system HOST and the display device 10 (or one or more display devices). For example, the network communication unit 270 may include a communication module including an antenna pattern capable of implementing mobile communication, data communication, Bluetooth, RF, Ethernet, and the like.

The network communication unit 270 may transmit and receive a wireless signal with at least one of a base station, an external terminal, or a server on a mobile communication network implemented according to a technology standard or communication method for mobile communication (e.g., global system for mobile communication (GSM), code division multi access (CDMA), code division multi access 2000 (CDMA2000), enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTE-A), 5G, and the like) through an antenna pattern.

The network communication unit 270 may transmit and receive a wireless signal in a communication network according to wireless Internet technologies through an antenna pattern. For example, wireless Internet technologies may be wireless LAN (WLAN), wireless-fidelity (Wi-Fi), wireless fidelity (Wi-Fi) direct, digital living network alliance (DLNA), wireless broadband (WiBro), world interoperability for microwave access (WiMAX), high speed downlink packet access (HSDPA), high speed uplink packet access (HSUPA), long term evolution (LTE), or long term evolution-advanced (LTE-A), and the antenna pattern may transmit and receive data according to at least one wireless Internet technology within a range including Internet technologies not listed above.

The UI generating unit 280 generates a UI menu for communication between the host system HOST and other display devices 10, and may be implemented by an algorithm code and an OSD IC. The UI menu for communication with the host system HOST and other display devices 10 may be a menu for designating a counterpart digital TV for communication and selecting a desired function.

The control unit 290 may be in charge of overall control of the display device 10, and may be in charge of communication control with the host system HOST and other display devices 10. The control unit 290 may store a corresponding algorithm code for control, and may be implemented by a microcontroller unit (MCU) in which the stored algorithm code is executed.

The control unit 290 may control to transmit a corresponding control command and data to the host system HOST and other display devices 10 through the network communication unit 270 according to input and selection of the user input unit 250. The control unit 290 may receive a suitable control command (e.g., a predetermined control command) and data from the host system HOST and the display device 10 and execute an operation according to the corresponding control command.

What is claimed is:

1. A display device comprising:
   a substrate comprising a first surface, a second surface opposite to the first surface, a first chamfered surface extending from one side of the first surface, a second chamfered surface extending from one side of the second surface, and a side surface connecting the first chamfered surface to the second chamfered surface;
   a pixel on the first surface of the substrate and comprising a light emitting element to emit light;
   a plurality of front pad parts on an edge of the first surface of the substrate and electrically connected to the pixel;
   a plurality of rear pad parts on an edge of the second surface of the substrate; and
   a plurality of side surface connection lines on the side surface of the substrate electrically connecting the plurality of front pad parts to the plurality of rear pad parts,
   wherein the plurality of front pad parts comprises a plurality of first front pad parts configured to supply a data voltage to the pixel, and a second front pad part configured to supply a power voltage to the pixel, and
   wherein an area of the second front pad part is larger than an area of one of the plurality of first front pad parts.

2. The display device of claim 1, wherein the plurality of rear pad parts comprises:
   a plurality of first rear pad parts electrically connected to the plurality of first front pad parts; and
   a second rear pad part electrically connected to the second front pad part,
   wherein an area of the second rear pad part is larger than an area of one of the plurality of first rear pad parts.

3. The display device of claim 2, wherein some of the plurality of side surface connection lines is connected in one-to-one correspondence to each of the plurality of first front pad parts, and
   wherein some other ones of the plurality of side surface connection lines are connected many-to-one to the second front pad part.

4. The display device of claim 2, further comprising:
   a plurality of first rear surface connection lines on the second surface of the substrate and connected to the plurality of first rear pad parts; and
   a second rear surface connection line on the second surface of the substrate and connected to the second rear pad part,
   wherein a width of the second rear surface connection line is greater than a width of one of the plurality of first rear surface connection lines.

5. The display device of claim 4, further comprising:
   a plurality of first contact pad parts on the second surface of the substrate and connected to the plurality of first rear surface connection lines; and
   a second contact pad part on the second surface of the substrate and connected to the second rear surface connection line,
   wherein an area of the second contact pad part is larger than an area of one of the plurality of first contact pad parts.

6. The display device of claim 1, wherein each of the plurality of side surface connection lines comprises:
   a front portion on the first surface of the substrate and connected to the plurality of front pad parts;
   a first chamfer portion on the first chamfered surface of the substrate and connected to the front portion;
   a side portion on the side surface of the substrate and connected to the first chamfer portion;
   a second chamfer portion on the second chamfered surface of the substrate and connected to the side portion; and
   a rear portion on the second surface of the substrate and connected between the second chamfer portion and a rear pad part of the plurality of rear pad parts.

7. The display device of claim 6, wherein each of the front portions of some of the plurality of side surface connection lines is connected in one-to-one correspondence to each of the plurality of first front pad parts, and
   wherein the front portions of some others of the plurality of side surface connection lines are connected many-to-one to the second front pad part.

8. The display device of claim 1, wherein the plurality of side surface connection lines comprises:
   a plurality of first side surface connection lines connected to the plurality of first front pad parts; and
   a second side surface connection line electrically connected to the second front pad part,
   wherein a width of the second side surface connection line is greater than a width of one of the plurality of first side surface connection lines.

9. The display device of claim 8, wherein each of the plurality of first side surface connection lines is connected in one-to-one correspondence to each of the plurality of first front pad parts, and
   wherein the second side surface connection line is connected one-to-one to the second front pad part.

10. The display device of claim 8, wherein the plurality of rear pad parts comprises:

a plurality of first rear pad parts electrically connected to the plurality of first front pad parts; and a second rear pad part electrically connected to the second front pad part, wherein an area of the second rear pad part is larger than an area of one of the plurality of first rear pad parts.

11. The display device of claim 10, wherein each of the plurality of first side surface connection lines is connected in one-to-one correspondence to each of the plurality of first rear pad parts, and wherein the second side surface connection line is connected one-to-one to the second rear pad part.

12. The display device of claim 10, wherein the second side surface connection line comprises:

a front portion on the first surface of the substrate and connected to the second front pad part;

a first chamfer portion on the first chamfered surface of the substrate and connected to the front portion;

a side portion on the side surface of the substrate and connected to the first chamfer portion;

a second chamfer portion on the second chamfered surface of the substrate and connected to the side portion; and a rear portion on the second surface of the substrate and connected between the second chamfer portion and the second rear pad part.

13. A display device comprising:

a substrate comprising a first surface, a second surface opposite to the first surface, a first chamfered surface extending from one side of the first surface, a second chamfered surface extending from one side of the second surface, and a side surface connecting the first chamfered surface to the second chamfered surface;

a pixel on the first surface of the substrate and comprising a light emitting element to emit light;

a plurality of front pad parts on an edge of the first surface of the substrate and electrically connected to the pixel;

a plurality of rear pad parts on an edge of the second surface of the substrate; and a plurality of side surface connection lines on the side surface of the substrate electrically connecting the plurality of front pad parts to the plurality of rear pad parts, wherein the plurality of front pad parts comprises a plurality of first front pad parts configured to supply a data voltage to the pixel, and at least one second front pad part configured to supply a power voltage to the pixel, and wherein the plurality of side surface connection lines comprises a plurality of first side surface connection lines connected to the plurality of first front pad parts, and a second side surface connection line electrically connected to the at least one second front pad part, wherein the second side surface connection line comprises:

a plurality of front portions on the first surface of the substrate and connected to the at least one second front pad part; and a rear portion on the second surface of the substrate and connected to one of the plurality of rear pad parts.

14. The display device of claim 13, wherein the second side surface connection line further comprises:

a plurality of first chamfer portions on the first chamfered surface of the substrate and connected to the plurality of front portions;

a plurality of first side portions on the side surface of the substrate and connected to the plurality of first chamfer portions;

a second side portion on the side surface of the substrate and connected to the plurality of first side portions; and a second chamfer portion on the second chamfered surface of the substrate and connected between the second side portion and the rear portion.

15. The display device of claim 14, wherein the plurality of first side portions is branched into a plurality of portions from the second side portion on the side surface of the substrate.

16. The display device of claim 13, wherein an area of one of the plurality of first front pad parts and an area of one of the at least one second front pad part are substantially the same.

17. The display device of claim 13, wherein an area of one of the at least one second front pad part is larger than an area of one of the plurality of first front pad parts.

18. The display device of claim 13, wherein the plurality of rear pad parts comprises:

a plurality of first rear pad parts electrically connected to the plurality of first front pad parts; and a second rear pad part electrically connected to the second front pad part, wherein an area of the second rear pad part is larger than an area of one of the plurality of first rear pad parts.

19. A display device comprising:

a substrate comprising a first surface, a second surface opposite to the first surface, a first chamfered surface extending from one side of the first surface, a second chamfered surface extending from one side of the second surface, and a side surface connecting the first chamfered surface to the second chamfered surface;

a thin film transistor layer on the first surface of the substrate and comprising a thin film transistor;

a first source metal layer on the thin film transistor layer;

a second source metal layer on the first source metal layer;

a passivation layer on the second source metal layer;

a plurality of front pad parts in an area in which a part of the passivation layer is opened at an edge of the second source metal layer;

a plurality of first connection patterns on a first side of each of the plurality of front pad parts; and a second connection pattern on a second side adjacent to the first side of each of the plurality of front pad parts to connect the plurality of first connection patterns, wherein the plurality of first connection patterns and the second connection pattern are formed by stacking the first and second source metal layers.

20. The display device of claim 19, further comprising:

a plurality of rear pad parts disposed on an edge of the second surface of the substrate; and a plurality of side surface connection lines on the side surface of the substrate to electrically connect the plurality of front pad parts to the plurality of rear pad parts, wherein at least one side of each of the plurality of side surface connection lines is surrounded by the plurality of first connection patterns and the second connection pattern.

21. The display device of claim 19, wherein a height of the first and second connection patterns is higher than a height of a front pad part of the plurality of front pad parts.

22. The display device of claim 19, further comprising a third source metal layer between the thin film transistor layer and the first source metal layer, wherein the plurality of first connection patterns and the second connection pattern are formed by stacking the first to third source metal layers.

23. The display device of claim 22, further comprising a fourth source metal layer between the thin film transistor layer and the third source metal layer,
wherein the plurality of first connection patterns and the second connection pattern are formed by stacking the first to fourth source metal layers.

24. A tiled display device comprising:
a plurality of display devices configured to display an image; and
a coupling area between the plurality of display devices,
wherein at least one of the plurality of display devices comprises:
a substrate comprising a first surface, a second surface opposite to the first surface, a first chamfered surface extending from one side of the first surface, a second chamfered surface extending from one side of the second surface, and a side surface connecting the first chamfered surface to the second chamfered surface;
a pixel on the first surface of the substrate and comprising a light emitting element to emit light;
a plurality of front pad parts on an edge of the first surface of the substrate and electrically connected to the pixel;
a plurality of rear pad parts on an edge of the second surface of the substrate; and
a plurality of side surface connection lines on the side surface of the substrate to electrically connect the plurality of front pad parts to the plurality of rear pad parts,
wherein the plurality of front pad parts comprises a plurality of first front pad parts configured to supply a data voltage to the pixel, and a second front pad part configured to supply a power voltage to the pixel, and
wherein an area of the second front pad part is larger than an area of one of the plurality of first front pad parts.

25. The tiled display device of claim 24, wherein the light emitting element is a micro light emitting diode of a flip chip type.

26. The tiled display device of claim 24, wherein the substrate is made of glass.

27. The tiled display device of claim 24, wherein the plurality of rear pad parts comprises:
a plurality of first rear pad parts electrically connected to the plurality of first front pad parts; and
a second rear pad part electrically connected to the second front pad part,
wherein an area of the second rear pad part is larger than an area of one of the plurality of first rear pad parts.

28. The tiled display device of claim 24, wherein at least one of the plurality of display devices further comprises a circuit board on the second surface of the substrate and electrically connected to the plurality of rear pad parts.

29. The tiled display device of claim 24, wherein the plurality of display devices is arranged in a matrix form in M (M is a positive integer) rows and N (N is a positive integer) columns.

* * * * *